United States Patent
Yip

(10) Patent No.: US 6,545,618 B2
(45) Date of Patent: Apr. 8, 2003

(54) GENERATING LISTS OF POSITIONS OF COEFFICIENTS IN A CODE BLOCK TO BE ENTROPY CODED

(75) Inventor: Dominic Yip, Lindfield (AU)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/927,316

(22) Filed: Aug. 13, 2001

(65) Prior Publication Data

US 2002/0027516 A1 Mar. 7, 2002

(30) Foreign Application Priority Data

Sep. 1, 2000 (AU) .............................................. PQ9824

(51) Int. Cl.$^7$ ................................................ H03M 7/00
(52) U.S. Cl. ........................ 341/107; 382/240; 341/51
(58) Field of Search ................... 341/107, 51; 382/242, 382/240, 239

(56) References Cited

U.S. PATENT DOCUMENTS

| | | | | |
|---|---|---|---|---|
| 6,163,626 A | | 12/2000 | Andrew | 382/240 |
| 6,266,450 B1 | | 7/2001 | Yip et al. | 382/240 |
| 6,269,192 B1 | * | 7/2001 | Sodagar et al. | 382/240 |
| 6,327,392 B1 | * | 12/2001 | Li | 382/248 |
| 6,351,568 B1 | * | 2/2002 | Andrew | 382/239 |
| 6,393,060 B1 | | 5/2002 | Jeong | 375/240.19 |

OTHER PUBLICATIONS

JPEG 2000 Image Coding System, JPEG 2000 Committee Draft Version 1.0, Dec. 9, 1999; pp. 1–164.

\* cited by examiner

*Primary Examiner*—Peguy JeanPierre
(74) *Attorney, Agent, or Firm*—Fitzpatrick, Cella, Harper & Scinto

(57) ABSTRACT

A method of entropy coding symbols representative of a code block comprising transform coefficients of a digital image. The method comprises a significance propagation pass 314, a magnitude refinement pass 316, and a cleanup pass 318 for entropy coding the symbols. The method generates (1210,1211), prior to the significance propagation pass 314 of the current bitplane, a first list of positions of those coefficients in the code block that have symbols to be entropy coded during the significance propagation pass of the current bitplane. The method also generates (1208), prior to the magnitude refinement pass 316 of the current bitplane, a second list of positions of those said coefficients in the code block that have symbols to be entropy coded during the magnitude refinement pass of the current bitplane. The method further generates (916), prior to the cleanup pass 318 of the current bitplane, a third list of positions of those said coefficients in the code block that have symbols to be entropy coded during the cleanup pass of the current bitplane.

35 Claims, 19 Drawing Sheets

| Si[m-1,n-1] | Si[m-1,n] | Si[m-1,n+1] |
|---|---|---|
| Si[m,n-1] | "X[m,n]" | Si[m,n+1] |
| Si[m+1,n-1] | Si[m+1,n] | Si[m+1,n+1] |

Fig. 1  Prior Art

| 1 | 5 | 9 | 13 | 17 | 21 | 25 | 29 |
|---|---|---|---|---|---|---|---|
| 2 | 6 | 10 | 14 | 18 | 22 | 26 | 30 |
| 3 | 7 | 11 | 15 | 19 | 23 | 27 | 31 |
| 4 | 8 | 12 | 16 | 20 | 24 | 28 | 32 |
| 33 | 37 | 41 | 45 | 49 | 53 | 57 | 61 |
| 34 | 38 | 42 | 46 | 50 | 54 | 58 | 62 |
| 35 | 39 | 43 | 47 | 51 | 55 | 59 | 63 |
| 36 | 40 | 44 | 48 | 52 | 56 | 60 | 64 |

Fig. 2  Prior Art

GENERATING LISTS OF POSITIONS OF COEFFICIENTS IN A CODE BLOCK TO BE ENTROPY CODED

TECHNICAL FIELD OF THE INVENTION

The present invention relates generally to data compression and decompression, and, in particular to a method and apparatus for entropy coding. The present invention also relates to a computer program product comprising a computer program for entropy coding.

BACKGROUND ART

A call for proposals for the new JPEG-2000 standard was recently issued and a draft standard has been published entitled "Information Technology—JPEG 2000 Image coding System—JPEG 2000 Committee Draft version 1.0, Dec. 9, 1999" (herein after referred to as JPEG2000).

JPEG2000 proposes that the whole image be divided into one or more image tile components, each of which are then 2-D discrete wavelet transformed. The transform coefficients of each image tile component are then grouped into sub-bands, which sub-bands are further partitioned into rectangular code blocks before each code block is then entropy encoded. The transform coefficients of each code block are expressed in a sign-magnitude representation prior to entropy coding. The entropy encoding consists of two parts: a context generator and an arithmetic coder. The arithmetic coder takes as input the bit symbol of a coefficient to be encoded and the context of that bit symbol. The context of a bit symbol of a coefficient, which bit symbol is to be coded by the arithmetic coder, is based on the 'significance' states of the 8 surrounding coefficients in the same bit-plane of the code block. The 'significance' state of a coefficient is a binary-valued variable $S_i[m,n]$, which is initialised to 0, but transitions to 1 immediately after the coefficient's first non-zero bit value is encoded. FIG. 1 shows the neighbouring significance states $S_i[m-1,n-1]$, $S_i[m-1,n]$ $S_i[m-1,n+1]$, $S_i[m,n-1]$ $S_i[m,n+1]$, $S_i[m+1,n-1]$, $S_i[m+1,n]$ and $S_i[m+1,n+1]$ of the 8 surrounding coefficients of a coefficient "X[m,n]", where m,n are the row and column numbers respectively of the code block and $S_i[\ ]$ is the significance state immediately prior to the encoding of the bit symbol i of the coeficient X[m,n]. These neighbouring significance states are sometimes referred to as the significance states of the 3×3 neighbourhood of the coefficient X[m,n].

The arithmetic coder first codes all the bit symbols of the most significant bit-plane of a code block, then all the bit symbols of the next lower bit-plane of the code block and so on to a least significant bit-plane. Within each bit-plane of a code block, the arithmetic coder codes the bit symbols of the coefficients in three passes in a predetermined order.

The first pass of a bitplane is called the significance propagation pass (SP pass), the second pass of the bitplane is called the magnitude refinement pass (MR pass), and the third and last pass of the bitplane is called the cleanup pass (N pass). During the SP pass, a bit symbol of the bitplane is encoded if the bit symbol to be encoded has a neighbouring bit symbol, which has a significance state of one(1) but has itself a significance state of zero(0). During the MR pass, a bit symbol of the bitplane is encoded, if not already encoded, if the coefficient of that bit symbol is already significant in the previous encoded bitplane. During the N pass, the remaining bit symbols of the bitplane that have not already been encoded are then encoded.

The context is delivered to the arithmetic coder along with the bit to be encoded and the encoded symbol is output to the bitstream. If the value of this bit symbol to be coded is one (1) and the significance state is zero then the significance state is set to one (1) once the bit symbol is coded and the next immediate bit symbol to be coded is the sign bit for the coefficient. Otherwise, the significance state remains zero (0). When the contexts of successive coefficients and passes are considered, the most current significance state for this coefficient is used.

The arithmetic coder codes the bit symbols of a bitplane in the three passes (SP, MR, and N) in the same predetermined order. The arithmetic coder first proceeds to the highest bitplane that has a non-zero bit in it and skips the SP, MR passes and commences with the N pass. The arithmetic coder then proceeds to the next lower bit plane and codes the bit symbols in the three passes (SP, MR, and N) in that order. It then proceeds to the next lower bit plane and codes the bit symbols in the same order of passes (SP, MR, and N) and so on to the least significant bitplane.

In addition, each bitplane of a code block is scanned in a particular order. Starting at the top left, the first four bit symbols of the column are scanned. Then the first four bit symbols of the second column, until the width of the code-block has been covered. Then the second four bit symbols of the first column are scanned and so on. A similar scan is continued for any leftover rows on the lowest code blocks in the sub-band. FIG. 2 shows an example of the code-block scan pattern for a code block having 64 transform coefficients arranged in an 8×8 block. As can be seen in this example, the scanning is performed in consecutive strips of four rows. The code block is not limited to a 8×8 block and larger code blocks are envisaged, such as 64×64 code block. In the latter case, there will 16 consecutive strips of four rows. For ease of explanation, this scanning order is herein after referred to as the JPEG2000 scanning order.

The entropy decoding described in JPEG2000 is a mirror image of the entropy encoding. For instance, the decoder decodes the symbols in the same order that they were encoded. The entropy decoding also comprises two sections: a context generator and an arithmetic decoder. The arithmetic decoder takes as input the symbol to be decoded and the context of that symbol to be decoded. The context of a symbol to be decoded, which symbol is to be decoded by the arithmetic decoder, is based on the 'significance' states of the 8 surrounding coefficients in the same bit-plane of the code block. The 'significance' state of a coefficient is a binary-valued variable S[m,n], which is initialised to 0, but transitions to 1 when the coefficient's first non-zero bit-plane value is decoded. In this fashion, the significance states of the coefficients during the decoding phase mirrors the significance states of the coefficients during the encoding phase (see FIG. 2).

In JPEG2000 the arithmetic coding and decoding is performed bit-plane by bit-plane, from the most significant bit plane to the least significant bit plane. In the beginning the coding/decoding skips over all the bit planes with only zeroes in them, and would only begin operation on the first bit plane with non-zero elements in it. Once it reaches there, the codec operates on each successive bit-plane in three passes: significance propagation pass, magnitude refinement pass and cleanup pass.

A entropy codec has been proposed for implementing JPEG2000, which has the codec scanning through the whole bit-plane, and locating positions that have a certain characteristics. For example, in the significance propagation pass, the codec looks for positions that are not significant themselves, but have at least one significant coefficient in its 3×3 neighbourhood. In the magnitude refinement pass, the codec looks for positions that are significant already. In the cleanup pass, the codec looks for positions that are not coded/decoded before. Therefore, in the proposed codec every bit plane is scanned three times. This implies that the maximum throughput is one symbol per three cycles.

As we can see from the above, the main problem in the proposed codec is that for each pass the codec needs to scan through all the positions and decides whether they are coded/decoded in the current pass. That means that cycles are wasted scanning through positions that need not be coded.

SUMMARY OF THE INVENTION

It is an object of the present invention to substantially overcome, or at least ameliorate, one or more disadvantages of existing arrangements and/or proposals.

The present invention is a method for entropy coding symbols representative of a code block comprising transform coefficients of a digital image. The invention also includes a corresponding apparatus and a corresponding computer program product. Preferably, the method operates in a codec manner, in that the method is able to decode or encode the symbols performing substantially the same steps.

The entropy coding method processes each bitplane from a first bitplane to a predetermined minimum bitplane of the code block of transform coefficients. The entropy coding method generates a number of lists of positions of the coefficients in the block having symbols to be entropy encoded during the current bitplane of the block. The method then entropy codes the symbols of the coefficients in the current bitplane of the code block using the lists.

More specifically, the entropy coding method performs a significance propagation pass, a magnitude propagation pass, and a cleanup pass, in that order, for entropy coding the symbols of a code block. The entropy coding method generates prior to the current pass of the current bitplane, a list of those symbols to be entropy coded during the current pass. Specifically, the entropy coding method generates, prior to the significance propagation pass of a current bitplane, a first list of positions of those coefficients in the code block that have symbols to be entropy coded during the significance propagation pass of the current bitplane. The method also generates, prior to the magnitude refinement pass of the current bitplane, a second list of positions of those coefficients in the code block that have symbols to be entropy coded during the magnitude refinement pass of the current bitplane. The method further generates, prior to the cleanup pass of the current bitplane, a third list of positions of those coefficients in the code block that have symbols to be entropy coded during the cleanup pass of the current bitplane.

In this way, the entropy coding method is able to use the lists to directly access and entropy code the relevant symbols without scanning through all the symbols of the code block.

BRIEF DESCRIPTION OF THE DRAWINGS

A number of preferred embodiments of the present invention will now be described with reference to the drawings, in which:

FIG. 1 shows the neighbouring significance states of the 8 surrounding coefficients of a coefficient "X[m,n]" utilised in the prior art JPEG2000;

FIG. 2 is a schematic block diagram illustrating an example of the code-block scan pattern for a code block utilised in the prior art JPEG2000;

DETAILED DESCRIPTION INCLUDING BEST MODE

Figure 3:
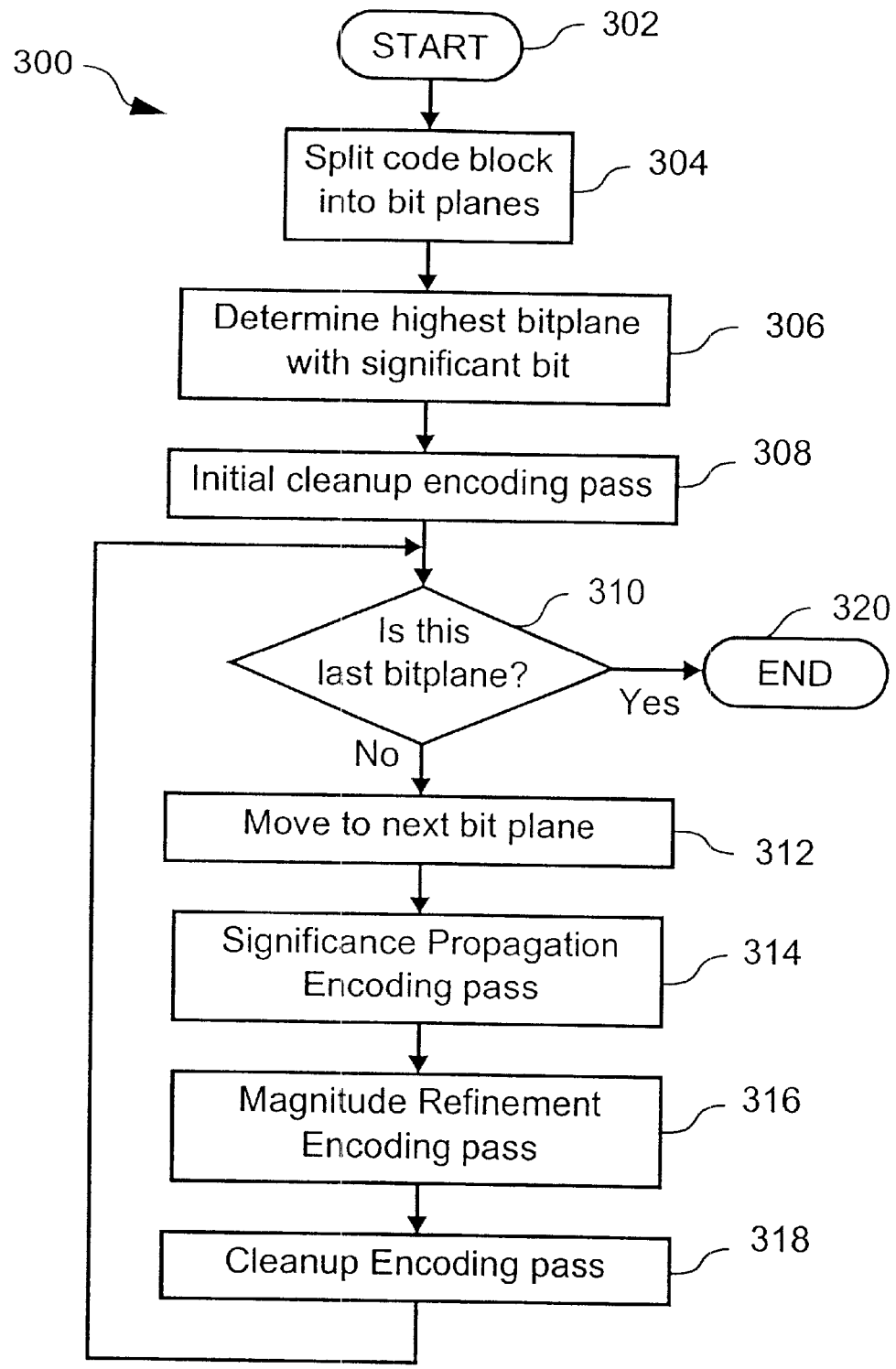
FIG. 3 shows a flow chart of a method of entropy coding in accordance with a first arrangement.

Where reference is made in any one or more of the accompanying drawings to steps and/or features, which have the same reference numerals, those steps and/or features have for the purposes of this description the same function(s) or operation(s), unless the contrary intention appears.

The principles of the preferred apparatus and method described herein have general applicability to data compression and decompression. However, for ease of explanation, the preferred apparatus and method are described with reference to digital image compression and decompression in accordance with the above mentioned JPEG2000. However, it is not intended that the present invention be limited to the described method and apparatus. For example, the invention may have application to digital video compression and decompression.

Before proceeding with a detailed description of the preferred method, a brief overview of the preferred method will now be described. Firstly, a whole image is divided into one or more image tile components, each of which are then 2-D discrete wavelet transformed. The transform coefficients of each image tile component are then grouped into sub-bands, which sub-bands are further partitioned into rectangular code blocks before each code block is then entropy encoded.

Turning now to FIG. 3, there is shown a flow diagram of a method 300 of entropy coding symbols of the transform coefficients of a code block in accordance with a first arrangement. Preferably, the method 300 is called for each code block of the image. The method operates in a codec manner, in that the method is able to decode or encode the symbols. During either encoding or decoding the method performs substantially the same steps. The decoding process mirrors the encoding process in that it also uses a significance propagation list, a magnitude refinement list, and a cleanup list. However, during the decoding there is no source code block to be split into bit planes, and the location of the most significant bit plane is already provided. For ease of explanation, the method of entropy coding is explained primarily with reference to the encoding process.

The method 300 commences at step 302 where any necessary parameters are initialised. During the initialisation phase, the method 300 generates a significance table. This significance table comprises a two-dimensional array of significance states of the coefficients of the code block to be coded. Initially, each entry of the array is set to zero (0) indicating that each coefficient has an insignificant state. The significance state of a coefficient transitions to one (1) when the coefficient's first non-zero bit-plane value is coded and the corresponding entry of the array is reset to one (1). The significance table may be updated during any called significance propagation encoding pass or during any cleanup encoding pass.

Also during the initialisation phase, the method generates three lists named herein as a Significance Propagation list (SP list); a Magnitude Refinement list (MR list); and a Cleanup list (N list). These lists contain the positions of the bit symbols within the code block that are to be coded during the current passes. For instance, the Significance Propagation list contains a list of all those positions of the bit symbols within the code block that are to be coded during a current Significance Propagation Pass. The term the position of the bit symbol refers to herein as the array position within the code block of the transform coefficient to which that bit symbol forms a part of. In addition, the positions within each of these lists are indexed according to the code block scanning order (see FIG. 2). Initially, the Significance Propagation list (SP list) and Maximum Refinement list (MR list) are empty. On the other hand, the Cleanup list (N list) lists all the positions within the code block and is used for the encoding of the highest bitplane having a non-zero bit.

The SP and MR list may be updated during the processing of the method by the addition and deletions of further positions as needed. Furthermore, a current N list will be generated during the SP coding pass to contain those positions not in the current SP and MR list.

After commencement 302, the transform coefficients of the code block are then received and split 304 into bit planes. In the next step 306 the bit planes of the code block are examined to determine which bit plane has the most significant non-zero bit in it.

The method then proceeds to step 308, where the bit plane with the most significant bit is entropy coded in one single cleanup pass. Specifically, the bit symbols belonging to the bitplane, which has the highest non-zero bit are each entropy encoded. These bit symbols are entropy encoded in a predetermined scanning order, for example as shown in FIG. 2. The entropy encoding step 308 takes as input the bit symbol to be encoded and its context, which context is preferably determined in accordance with JPEG2000. At the same time, lists of positions to be processed in the significance propagation pass and magnitude refinement pass are generated, so that the method can efficiently process the bits in the next bit plane. During the initial cleanup pass 308, when a bit symbol is found to be significant, its associated position is added to the current MR list. During the initial cleanup encoding pass, the method also determines those insignificant neighbours in the 3×3 neighbourhood of the positions found to be significant. These positions are then added to the current SP list.

After completion of step 308, the method proceeds to decision block 310, where a check is made whether there are any more bit planes to be processed. If there are, then the method proceeds to step 312 where the bit symbols of the next bit plane are retrieved.

The method then proceeds to step 314 for processing the relevant bit symbols in the significance propagation pass of the current bit plane. In this step 314, the bit symbols in the current bitplane corresponding to the positions in the current SP list are entropy encoded. During the SP encoding pass 314, when a bit symbol is found to be significant, its associated position is added to a new MR list. This new MR list is merged with the current MR list after the completion of the next cleanup encoding pass 318 in order to avoid encoding twice. Also during the SP encoding pass 314, when a bit symbol is found to be significant, the method determines the insignificant neighbours of the position (P) of that significant bit symbol. The method then adds any of these insignificant neighbours, which are prior to that position (P) in the scanning order to a new SP list. On the other hand, the method adds any of these insignificant neighbours, which are after that position (P) in the scanning order to the current SP list. The method then reindexes the updated current SP list. During the SP encoding pass 314, the method also commences generating the N list using the updated current SP list and current MR list.

After the completion of the SP encoding pass 314, the method proceeds to magnitude refinement encoding pass 316. In this step 316, all the bit symbols in the current bit plane corresponding to the positions in the magnitude refinement list are entropy encoded.

After completion of the MR encoding pass 316, the method proceeds to the cleanup encoding pass 318. In the cleanup encoding step 318, all the bit symbols in the current bit plane corresponding to the positions in the current cleanup N list (generated during the previous SP coding pass) are entropy encoded. During the cleanup encoding pass 318, when a bit symbol is found to be significant, its associated position is added to the new MR list. The method also determines those insignificant neighbours of the positions listed in the new MR list. The positions of these insignificant neighbours are then deleted from the cleanup list and added to the new SP list. The new MR list and new SP list are then merged with the current MR list and SP list respectively. The newly merged MR and SP lists are then re-indexed in accordance with the scanning order.

After completion of the cleanup coding pass 318, the method returns to decision block 310 for processing of any further bit planes. If the decision block returns true (YES), that is there are no more bit planes to be processed, then the method terminates 300. Preferably, the method processes the bitplanes from the highest bitplane containing a significant bit down to a predetermined minimum bitplane. During the encoding phase, the method adds information to a header of the encoded bitstream, which information identifies the highest bitplane and the predetermined minimum bitplane. During the decoding phase, the method uses this header information in decoding the encoded bitstream.

Figure 4:
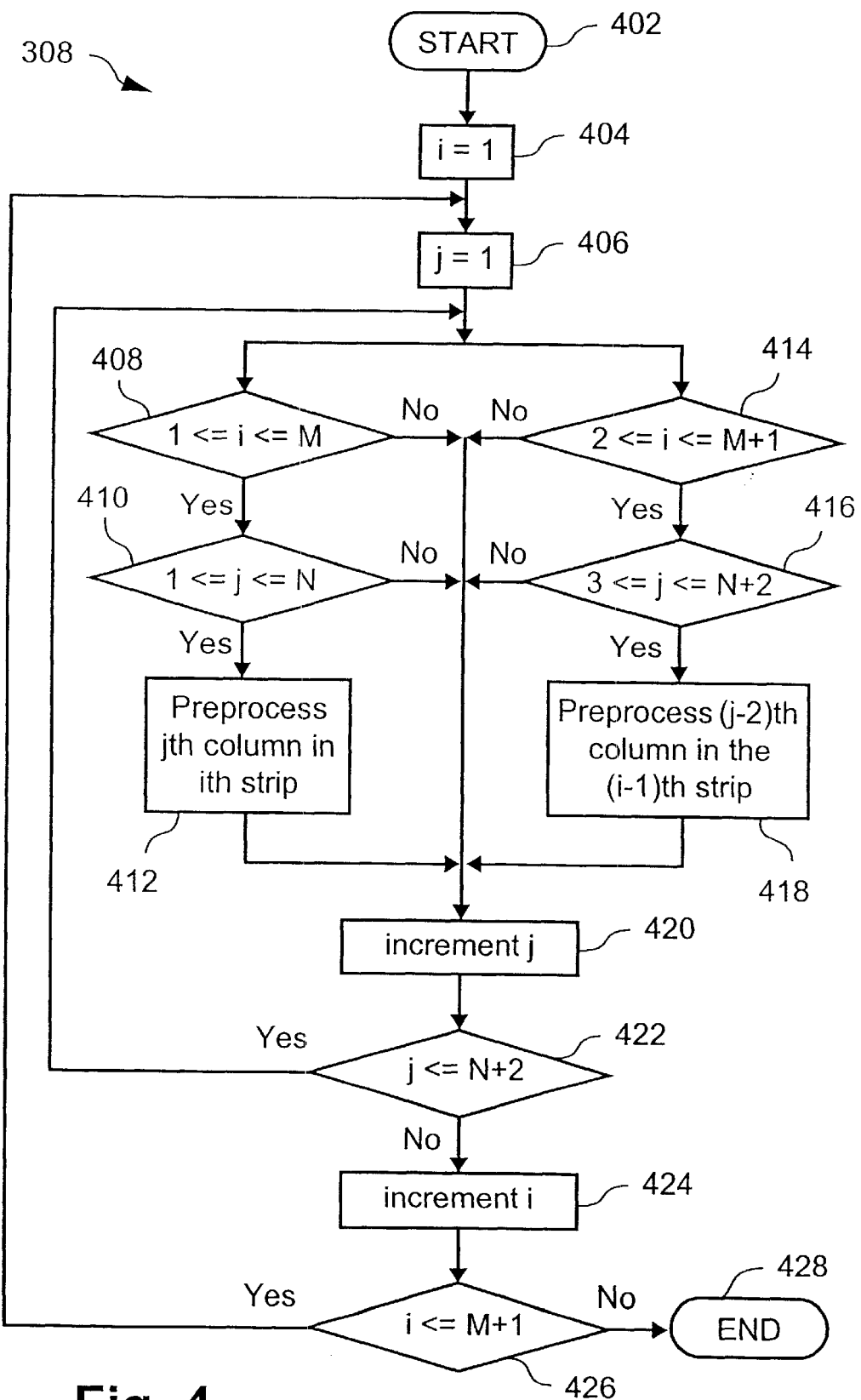
FIG. 4 shows a flow chart of the initial cleanup encoding step 308 used in the method of entropy coding shown in FIG. 3.

Turning now to FIG. 4, there is shown a flow chart of the initial cleanup encoding step 308 used in the method of entropy encoding shown in FIG. 3. The cleanup encoding step 308 commences processing the highest bitplane that has a significant bit in it. In the beginning of the initial cleanup encoding step 308 the significance propagation (SP) list and the magnitude refinement (MR) lists are empty, so all the coefficients are coded during this cleanup pass. For each coefficient of this bitplane, the intial cleanup encoding step 308 performs the following operations: (1) If the coefficient is significant in this bit plane, then it is added to the MR list; (2) If any coefficient in the 3×3 neighbourhood of that coefficient is significant, but the coefficient itself is not significant, then it is added to the SP list.

At the end of the initial cleanup encoding step 308, the MR list and SP list are complete, ready to be used for the next step. The initial cleanup encoding step 308 performs these operations by encoding each bit symbol of the coefficients in this bitplane during a pre-processing step 412, and writing information to memory concerning the significances of the coefficients currently being pre-processed 412 and any insignificant neighbours within the 3×3 neighbourhood of those significant coefficients. The memory is in a continual state of being updated as the bit symbols are being pre-processed as will be explained in more detail below. The cleanup encoding step 308 also determines during a post-processing step 418, whether or not a coefficient is to be added to the MR or SP list by utilising the information written to memory as will be explained in more detail below.

The initial cleanup encoding step 308 is a sub-procedure and is called by the main method 300 for processing the highest bitplane that has a significant bit in it. The initial encoding step 308 commences at step 402. This sub-procedure then proceeds to steps 404 and 406 where the variables i and j are both set to one. The variable j is used as a column counter and the variable i as a strip counter to enable the initial cleanup encoding step 308 to process the columns and strips of the bitplane of the code block in JPEG2000 scanning order. The code block has M strips of N columns of bit symbols. The values of M and N will vary depending upon the size of the code block.

The initial cleanup encoding step 308 then proceeds to decision block 408, where a check is made whether the strip counter i is greater than or equal to one and less than or equal to the total number of strips M in the code block. If the decision block 408 returns yes (TRUE), the initial cleanup encoding step 308 proceeds to decision block 410. The decision block 410 then checks whether the column counter j is greater than or equal to one and less than or equal to the total number of columns N in the code block. If the decision block 410 returns yes (TRUE), the initial cleanup encoding step 308 proceeds to a pre-processing step 412, which pre-processes the jth column of the ith strip of that bitplane and writes information to memory. This pre-processing step 412 will be described in more detail below with reference to FIG. 5. After the completion of the pre-processing step 412, the initial cleanup encoding step 308 proceeds to step 420. If any one of the decision blocks 408 and 410 return no (FALSE), the initial cleanup encoding step 308 by-passes the pre-processing step 412 and proceeds directly to step 420.

At the same time, the initial cleanup encoding step 308 proceeds to a decision block 414, where a check is made whether the strip counter i is greater than or equal to 2 and less than or equal to M+1, where M is the total number of strips in the code block. If the decision block 414 returns yes (TRUE), the initial cleanup encoding step 308 proceeds to decision block 416, where a check is made whether the column counter j is greater than or equal to three (3) and less than or equal to N+2, where N is the total number of columns in the strip. If the decision block 416 returns yes (TRUE), the initial cleanup encoding step 308 proceeds to a post-processing step 418 for post processing the (j−2)th column of the (i−1)th strip. The post processing step 418 determines whether a coefficient is to be added to the MR or SP list utilising the information already written in memory. This post-processing step 418 will be described in more detail below with reference to FIG. 6. After the completion of the post-processing step 418, the initial cleanup encoding step 308 proceeds to step 420. If any one of the decision block 414 and 416 return no (FALSE), the sub-procedure 308 by-passes this post-processing step 418 and proceeds directly to step 3420. In this fashion, the pre-processing step 412 processes the jth column of the ith strip at the same time as the post-processing step 418 is processing the (j−2)th column of the (i−1)th strip.

During step 420, the initial cleanup encoding step 308 increments the column counter j by one. The initial cleanup encoding step 308 then proceeds to decision block 422, where a check is made whether the column counter j is less than or equal to N+2, where N is the total number of columns in the strip. If the decision block 422 returns yes (TRUE), then initial cleanup encoding pass 308 returns to decision blocks 408 and 414 for processing of the next column j. On the other hand, if the decision block 422 returns No (FALSE), the initial cleanup encoding step 308 proceeds to step 424, where the strip counter i is incremented by one. The initial cleanup encoding step 308 then proceeds to decision block 426, where a check is made whether the strip counter i is less than or equal to M+1, where M is the total number of strips in the code block. If the decision block 426 returns yes (TRUE), the initial cleanup encoding step 308 returns to step 406 for further processing of the next strip.

As mentioned above, the cleanup encoding step 308 reads information written to memory so as to determine whether a coefficient is to be added to the MR or SP list. This memory is in the form of a current strip register, a previous strip register, a current next strip line store, a previous next strip line store, and a previous strip line store.

The previous strip register and current strip register are each arranged as a 4×N register array having four rows and N columns, which array comprises in total 4N entries. This arrangement of the previous strip register and current strip register acts as a double buffering arrangement. The four rows of the previous strip register correspond to the consecutive four rows, respectively, of (i−1)th strip of the code block, and the N columns of the previous strip register correspond to the N columns of the (i−1)th strip of the code block. On the other hand, the four rows of the current strip register correspond to the consecutive four rows, respectively, of ith strip of the code block, and the N columns of the current strip register correspond to the N columns of the ith strip of the code block. Each entry of the previous strip register and current strip register corresponds to a coefficient of the code block and comprises two bits N, S. The S bit indicates whether or the coefficient corresponding to that entry is significant. The N bit indicates whether the coefficient corresponding to that entry is in the 3×3 neighbourhood of a significant coefficient. The current strip register is continually being updated during the pre-processing step 412. For example, during the pre-processing 412 of the jth column of the ith strip, the S bits of the jth column of the current strip register will be updated and the corresponding N bits will be updated for columns j−1, j, j+1, depending upon the significances of the coefficients in the jth column of the ith strip of the code block. After completion of the pre-processing of the last column of the ith strip (during step 424), the contents of the current strip register are output to the previous strip register, and the N,S bits of the current strip register are reset to zero. Thus the previous strip register during the pre-processing of the (i+1)th strip contains the completed update of the current strip register for the ith strip. At the same time as the pre-processing step 412 is updating the current strip register for the ith strip, the post-processing 418 is reading the N,S bits from the previous strip register.

The previous next strip line store and the current next strip line store are each arranged as 1×N line store. This arrangement of the previous next strip line store and current next strip line store acts as a double buffering arrangement. The previous next strip line store corresponds to the first row of the ith strip. The previous next strip line store stores column numbers for those positions of insignificant coefficients in the first row of the ith strip which have a significant coefficients in the last row of the (i−1)th strip in their 3×3 neighbourhood. The line of the current next strip line store corresponds to the first row of (i+1)th strip. The current next strip line store stores column numbers for those positions of insignificant coefficients in the first row of the (I+1) strip which have a significant coefficients in the last row of the ith strip in their 3×3 neighbourhood. In both cases, the column numbers are stored in JPEG2000 scanning order one after another in the line stores commencing at the head of the line stores. At any one time, both the current next strip line store and previous strip line store can store up to N column numbers. In the event, there are less than N column numbers, the remaining entries and the end of the line stores are left blank. The current next strip line store is continually being updated during the pre-processing step 412. For example, during the pre-processing 412 of the jth column of the ith strip, the column number of any positions within the first row of the (i+1)th strip that are within the 3×3 neighbourhood of a significant coefficient of the jth column of the ith strip are added to the current next strip line store. After completion of the pre-processing of the last column of the ith strip (during step 424), the contents of the current next strip line store are output to the previous next strip line store, and the entries of the current next strip line store are reset to zero. Thus the previous next strip line store during the pre-processing of the (i+1)th strip contains the completed update of the current next strip line store for the ith strip. The pre-processing step 412 during the processing of the ith strip updates the current next strip line store for the (i+1)th strip and reads the previous next strip line store for the ith strip.

The previous strip line store is arranged as 1×4 line store. The line of the previous strip line store corresponds to the last row of the (i−1)th strip of columns j−2, j−1, j, j+1. The previous strip line store stores column numbers for those positions of insignificant coefficients in the last row of the (I−1)th strip which have a significant coefficient in the first row of the ith strip in their 3×3 neighbourhood. The column numbers are stored in JPEG2000 scanning order. The previous strip line store is continually being updated during the pre-processing step 412. For example, during the pre-processing 412 of the jth column of the ith strip, the column number of any positions within the last row of the (i−1)th strip that are within the 3×3 neighbourhood of a significant coefficient of the jth column of the ith strip are added (if not already there) to the previous strip line store. At the same time, the post-processing step 418, is reading the first entry of the previous strip line store. The column numbers are stored in the previous strip line store in JPEG2000 scanning order one after another in the line stores commencing at the head of the line store. At any one time, the previous strip line store can store up to 4 column numbers. In the event, there are less than 4 column numbers, the remaining entries and the end of the previous strip line store are left blank.

Figure 5:
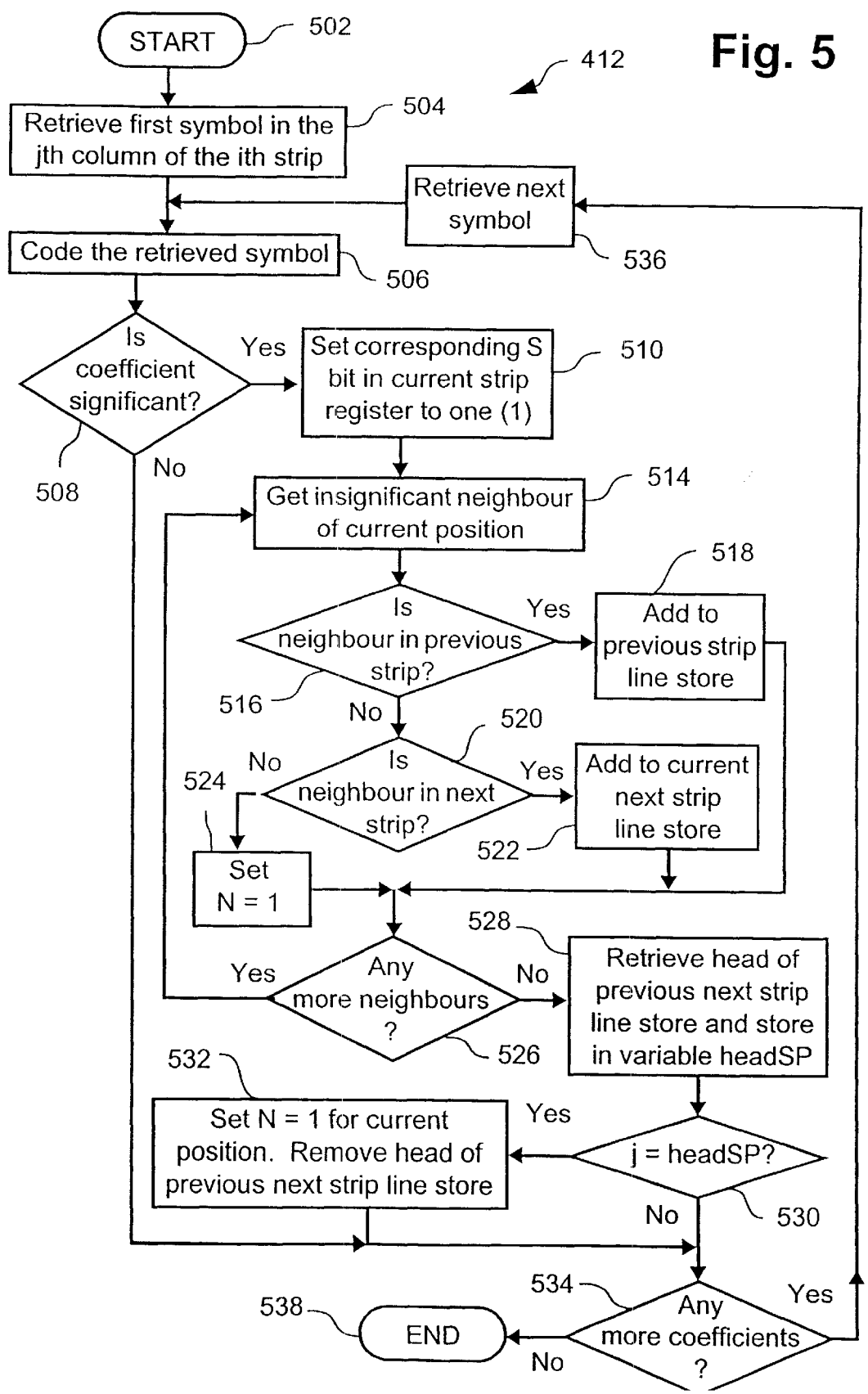
FIG. 5 shows in more detail a flow chart of the pre-processing step 412 of the jth column of the ith strip as depicted in FIG. 4.

Turning now to FIG. 5, there is shown in more detail a flow chart of the pre-processing step 412 of the jth column of the ith strip as depicted in FIG. 4. The pre-processing step 412 commences at step 502, and proceeds to step 504 where the first bit symbol in the jth column of the ith strip is retrieved. This retrieved bit symbol is that one which is first in the JPEG2000 scanning order for the jth column and ith strip (viz in row one). The pre-processing step 412 then proceeds to step 506, where the coding and context generation is performed in accordance with the JPEG2000 on the retrieved bit symbol. After completion of the coding, the step 506 also updates the significance table, if required. The significance state of a coefficient transitions to one (1) when the coefficient's first non-zero bit-plane value is encoded and the corresponding entry of the array of the table is reset to one (1). Specifically, if the current coded bit symbol belonging to a coefficient is a one (1) the significance for that coefficient stored in the significance table is set to one (1). After the completion of step 506, the pre-processing step 412 proceeds to a decision block 508, where is check is made whether the encoded bit belongs to a coefficient which is significant. If the decision block 508 returns yes (TRUE), the pre-processing step 412 proceeds to step 510, where the bit S in the jth column of current strip register corresponding to this retrieved bit symbol is set to one(1). If the decision block 508 returns No (FALSE), ie the coefficient is not significant, the pre-processing step 412 proceeds directly to decision block 534.

After step 510, the pre-processing step 412 proceeds to a loop 514 to 526 where each insignificant neighbour in the 3×3 neighbourhood of the current significant coefficient is processed in turn. During step 514, the pre-processing step 412 gets an insignificant neighbour (if any) of the current significant coefficient. The step 514 determines the insignificant neighbours of the current significant coefficient by looking up the significance table. If there are no insignificant neighbours the pre-processing step 412 proceeds directly (not shown) to decision block 534. On the other hand, if there are insignificant neighbours the pre-processing step 412 proceeds to decision block 516, where a check is made whether the current neighbour is in the previous strip (i−1). If the decision block 516 returns yes (TRUE), the pre-processing step 412 proceeds to step 518, where the column number of the current neighbour is added to the previous strip line store. After step 518, the pre-processing step 412 proceeds to decision block 526. On the other hand, if decision block 516 returns No (FALSE), the pre-processing step 412 proceeds to decision block 520, where a check is made whether the current neighbour is in the next strip (i+1). If the decision block 520 returns yes (TRUE), then the pre-processing step 412 proceeds to step 522, where the column number is added to the current next strip line store. After step 522, the pre-processing step 412 proceeds to decision block 526. On the other hand, if the decision block 520 returns No (FALSE), the pre-processing step 412 proceeds to step 524. During step 524, the pre-processing step 412 sets the bit N to one (1) in the entry in the current strip register corresponding to the current neighbour. After step 524, the pre-processing step 412 proceeds to decision block 526. Decision block 526 checks whether there are any more neighbours in the 3×3 neighbourhood of the current significant coefficient that have not been already processed by the loop 514 to 526. If the decision block 526 returns yes (TRUE), then the pre-processing step 412 returns to step 514 for processing of the next neighbour of the current significant coefficient. If the decision block 526 returns No (FALSE), then the pre-processing step proceeds to step 528.

During step 528, the pre-processing step 412 retrieves the head of the previous next strip line store, that is the first entry in the previous next strip line store according to the JPEG2000 scanning order, and allocates it to the variable headSP. During the initial pre-processing step 412 of the ith strip (ie j=1), the previous next strip line store corresponds to the first row of the ith strip and stores column numbers for those positions, which have a significant coefficient in the (i−1)th strip in their 3×3 neighbourhood. Thus during the initial pre-processing step 412 of the ith strip (ie j=1), the variable headSP contains the first column number stored in JPEG2000 scanning order in the previous next strip line store of the first row of the ith strip of a position, which has a significant coefficient in its 3×3 neighbourhood in the (i−1)th strip. After step 528, the pre-processing step 412 proceeds to decision block 530, where a check is made whether j=headSP. If the decision block 530 returns yes (TRUE), then the pre-processing step 412 proceeds to step 532, where the N bit is set to one (1) for the entry in the current strip register corresponding to the position (1, j). In this way, insignificant neighbours in the ith strip of significant coefficients in the (i−1)th strip are identified in the current strip register by the setting of their corresponding N bits. Also, during step 532, the pre-processing step 412 removes the current head of the previous next strip line store. Furthermore, the remaining column numbers are all shifted once to the head of the previous next strip line store. After completion of step 532, the pre-processing step 412 proceeds to decision block 534. On the other hand, if decision block 530 returns No (FALSE), the pre-processing step 412 proceeds directly to decision block 534. As will be apparent to a person skilled in the art, the previous next strip line store will initially store up to N column numbers. As the pre-processing step 412 is called for each column j=1, . . . , N, the pre-processing step 412 checks during decision block 530 if there exists a corresponding column number in the previous next strip line store. If so, an insignificant neighbour is identified as existing in the first row of that column and entered in the current strip register and removed from the previous next strip line store.

The decision block 534 determines whether there are any more bit symbols in the jth column that have not already been processed by the pre-processing step 412. If the decision block 534 returns yes (TRUE), then the pre-processing step 412 proceeds to step 536, where the next bit symbol in the column is retrieved. The pre-processing step 412 then returns to step 506 for the processing of this retrieved bit symbol. If on the other hand there are no more bit symbols in the column j to be processed, the decision block 534 returns No (FALSE) and the pre-processing step 412 terminates 538 and returns to the initial cleanup encoding step 308 for further processing.

Figure 6:
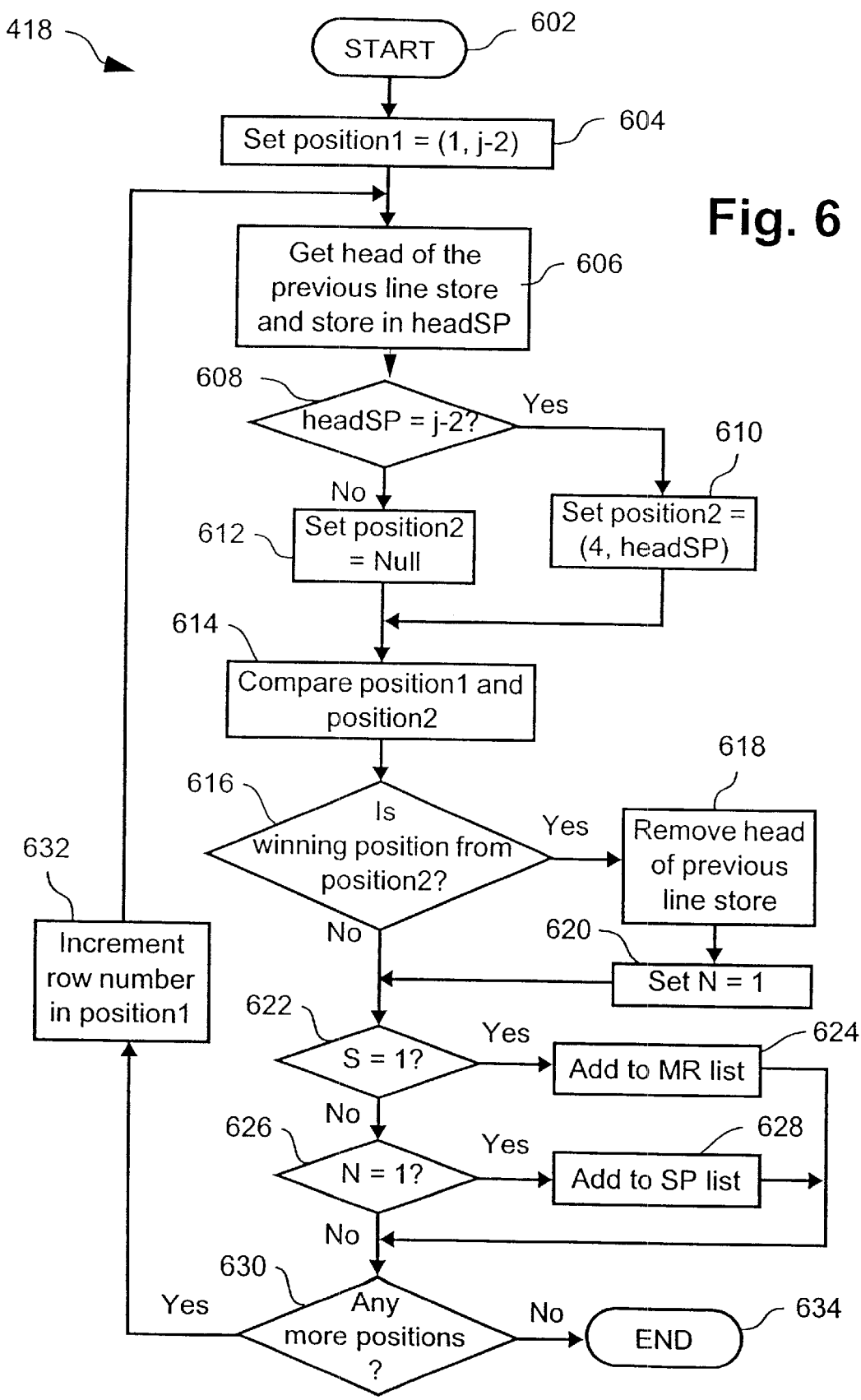
FIG. 6 shows in more detail a flow chart of the post-processing step 418 of the (j−2)th column of the (i−1)th strip as depicted in FIG. 4.

Turning now to FIG. 6, there is shown in more detail a flow chart of the post-processing step 418 of the (j−2)th column of the (i−1)th strip as depicted in FIG. 4. As mentioned previously, at the same time as the pre-processing step 412 is processing the jth column of the ith strip, the post-processing step 418 is processing the (j−2)th column of the (i−1)th strip.

The post-processing step 418 commences at step 602 and proceeds to step 604, where a variable position1 is set to (1, j−2). This variable position1 stores the (row, column) coordinates of the current position in the previous strip register to be processed by the post-processing step. After completion of step 604, the post-processing step 418 proceeds to step 610, where the entry stored at the head of the previous strip line store is retrieved and stored in a variable headSP. This variable headSP stores a column number for a position in the (i−1)th strip that has a significant coefficient in the ith strip, which is in its 3×3 neighbourhood. In the event, the previous strip line store is empty, the step 606 sets the variable headSP to Null.

After the completion of step 606, the post-processing step 418 proceeds to decision block 608, where a check is made whether the variable headSP=j−2. In the event the decision block 608 returns Yes (TRUE), the post-processing step 418 proceeds to step 610, where a variable position2 is set to (4, headSP). This variable position2 indicates the (row,column) of a bit symbol in the (i−1)th strip, which has a significant coefficient in its 3×3 neighbourhood in the ith strip. In the event the decision block 608 returns No (FALSE), this variable position2 is set 612 to Null. After completion of step 612, the post-processing step 418 proceeds to step 614.

During step 614, the post-processing step 418 compares the variables position1 and position2 and determines whether the variable position1 is before the variable position2 in the JPEG2000 scanning order. If so, it stores the variable position1 in a variable winning_position. If not, it stores the variable position2 in the variable winning_position. After completion of step 614, the post-processing step 418 proceeds to decision block 616, where a check is made whether the coordinates stored in the variable winning_position are from the variable position2 (viz the previous strip line store).

In the event the decision block 616 returns Yes (TRUE), the post-processing step proceeds to step 618, where the head of the previous strip line store corresponding to headSP is removed. Also, the remaining entries of the previous strip line store are each shifted by one to the head. After completion of step 618, the post-processing step proceeds to step 620, where the N bit, of the position in the previous strip register corresponding to the position stored in the variable winning_position, is set to one (1). After completion of step 620, the post-processing step 418 proceeds to decision block 622. In the event decision block 612 returns No (FALSE), the post-processing step proceeds directly to decision block 622.

The decision block 622 checks whether the S bit of the position in the previous strip register corresponding to the position stored in the variable winning_position is one (1). In the event the decision block 622 returns Yes (TRUE), the post-processing step 418 proceeds to step 624, where the position stored in the variable winning_position is added to the MR list. After completion of step 624, the post-processing step 418 proceeds to decision block 630. In the event the decision block 622 returns No (FALSE), the post-processing step 418 proceeds to decision block 626. The decision block 626 checks whether the N bit of the position in the previous strip register corresponding to the position stored in the variable winning_position is one (1). In the event the decision block 626 returns Yes (TRUE), the post-processing step 418 proceeds to step 628, where the position stored in the variable winning_position is added to the SP list. After completion of step 628, the post-processing step 418 proceeds to decision block 630. In the event the decision block 626 returns No (FALSE), the post-processing step 418 proceeds directly to decision block 630.

The decision block 630 checks whether there are any more positions in the (j−2)th column to be processed. Namely, it checks whether the row of the current position stored in the variable winning position is equal to four. If the decision block 630 returns No (FALSE), the post-processing step 418 proceeds to step 632, where the row number in the variable position1 is incremented by one (1). After step 632, the post-processing step 418 proceeds to step 606, where the post-processing 418 begins again for the new value stored in the variable position1. On the other hand, if the decision block 630 returns Yes (TRUE), the post-processing step 418 terminates 634 and returns to the cleanup encoding step 308 for further processing.

As can been seen from above, the pre-processing steps 412 for the ith strip generate the current N, S bits for storage in the current strip register, which are at completion of the pre-processing steps for the ith strip then output to the previous strip register. At the same time as the pre-processing steps 412 for the ith strip, the post-processing steps 418 process the N,S bits of the (i−1)th strip presently stored in the previous strip register, which were generated during the previous pre-processing steps 412 for the (i−1)th strip. The pre-processing steps 412 of the ith strip identify the significant coefficients and their insignificant neighbours in the ith strip and store them as N,S bits in the corresponding positions of the current strip register. It also identifies any insignificant neighbours in the first row of the ith strip of significant coefficients in the (i−1)th strip and stores these as N bits in the corresponding positions of the current register. The pre-processing steps 412 of the ith strip achieves the latter by retrieving the column numbers of any such insignificant neighbours currently stored in a previous next strip line store. These insignificant neighbours are identified in the previous pre-processing steps of the (i−1)th strip and stored in a current next strip line store and at the end of the pre-processing steps for the (i−1)th strip output to the previous next strip line store. The pre-processing steps 412 of the ith strip also identify any insignificant neighbours in the last row of the (i−1)th strip due to significant coefficients in the first row of the ith strip. The pre-processing steps 412 adds the column numbers of these insignificant neighbours to a previous strip line store. The post-processing steps 418 for the (i−1)th strip then retrieves these column numbers from the previous strip line store to update any corresponding N bits in the previous strip register. The post-processing step 418 for the (i−1)th strip uses the N,S bits stored in the updated previous strip register to identify those positions which can be added to the SP list or MR list. Specifically, those positions in the updated previous strip register having S bits set to one(1) are stored in the MR list, and those positions in the updated previous strip register having S=1 and N=0 are stored in the SP list.

Returning to FIG. 3, after completion of the initial cleanup encoding step 308, the method proceeds to decision block 310, where a check is made whether there are any more bit planes to be processed. If there are, then the method proceeds to step 312 where the bit symbols of the next bit plane are retrieved. The method then proceeds to step 314 for processing the relevant bit symbols in the significance propagation pass of the current bit plane.

Figure 7A:
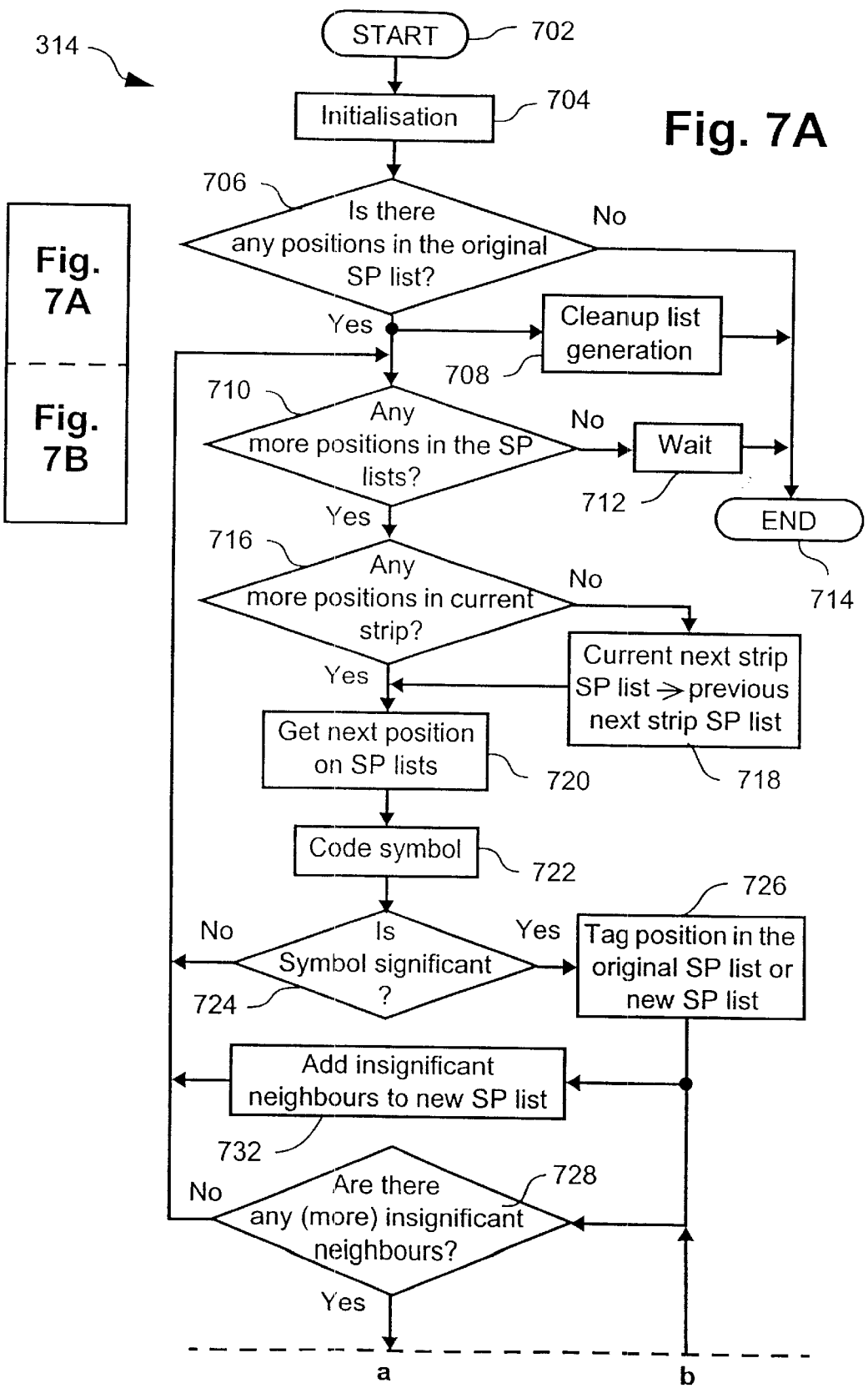
FIGS. 7A and 7B show a flow chart of the significance propagation (SP) coding step 314 of FIG. 3 in more detail.
Figure 7B:
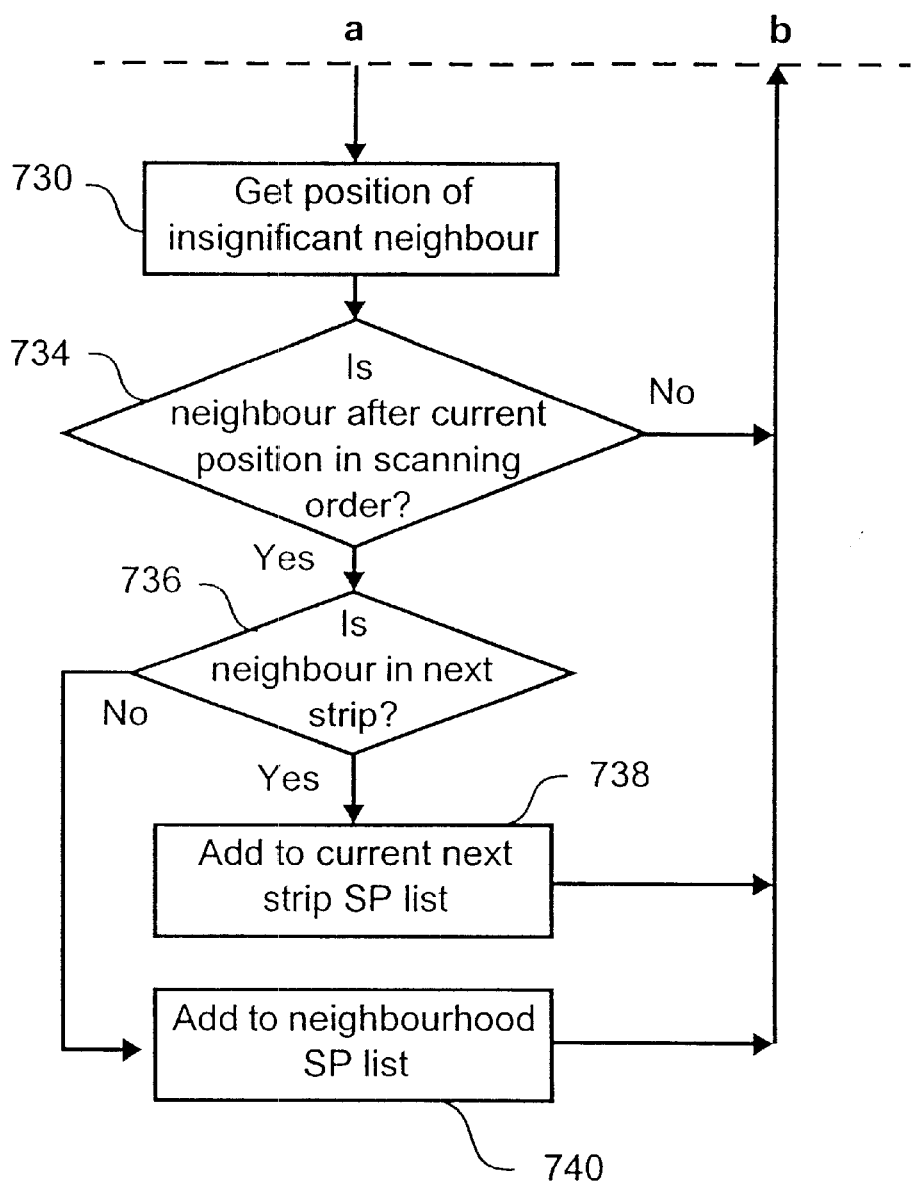
Figure 7B:
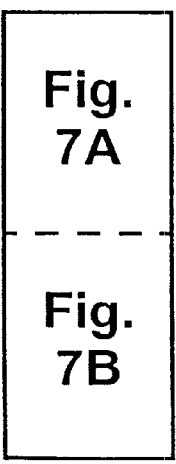

Turning now to FIGS. 7A and 7B, there is shown a flow chart of the significance propagation (SP) coding step 314 of FIG. 3 in more detail. This SP coding step 314 initially follows the initial cleanup encoding step 208, and thereafter follows the cleanup encoding step 318 for each bit plane after the initial bitplane. The SP coding step 314 is in the form of a sub-procedure, which is called by the entropy coding method 200. This SP coding step 314 commences 702 where the current SP list (herein after called the original SP list) is passed to the SP coding step 314 for processing. The previous initial cleanup step 308 or cleanup encoding step 318 generates this original SP list. The SP coding step 314 utilises five lists, the original SP list, which is passed to the SP coding step 314, a neighbourhood SP list, a current next strip SP list, a previous next strip SP list, and a new SP list. The SP coding pass 314 generates the latter four lists. The neighbourhood SP list, the previous next strip SP list, and current next strip SP list are local in that their use is restricted to the SP coding step 314. On the hand, the generated new SP list and an updated original SP list are passed to the entropy coding method for further processing during step 318.

The original SP list may be updated during the SP coding step 314 in that any coefficients corresponding to positions stored in this list that have subsequently become significant during the current SP encoding step 214 are identified by tagging. To this end, each entry of the original SP list comprises the (row, column) coordinates of the locations of the bit symbols in the current bitplane of insignificant coefficients which have significant coefficients in their 3×3 neighbourhood, and a flag indicating the significance of the bit symbol after the current SP encoding step 214.

The new SP list comprises the (row, column) coordinates of the locations of the bit symbols of insignificant coefficients having in their 3×3 neighbourhood any newly significant coefficients. These newly significant coefficients are those having bit symbols in the current bitplane which are encoded and whose significance state transitions to one (changes to significant) during the current SP encoding step 314. The new SP list may be updated during the SP coding step 314 in that any coefficients corresponding to positions stored in this list that have subsequently become significant during the current SP encoding step 314 are identified by tagging. To this end, each entry of the new SP list comprises the (row, column) coordinates of the locations of the bit symbols of insignificant coefficients having newly significant coefficients in their 3×3 neighbourhood, and a flag indicating the significance of the bit symbol after the current SP encoding step 314.

The neighbourhood SP list comprises the (row, column) coordinates of the locations within the code block of a number of bit symbols. The neighbourhood SP list is a sub-set of the new SP list, in that all the positions in the neighbourhood SP list are contained in the new SP list. The neighbourhood SP list contains those positions (but not all) of the insignificant coefficients within the 3×3 neighbourhood of a current significant coefficient that has just been decoded during the SP encoding step 314. The neighbourhood SP list stores only those positions within the 3×3 neighbourhood which are in the same strip of the code block as the current significant coefficient and which are after the current significant coefficient in the JPEG2000 scanning order.

The current next strip SP list comprises the column coordinates of locations of insignificant coefficients within the first row of the next strip within the 3×3 neighbourhood of coefficients in the current strip that have been found to be significant during the SP encoding step 314. The current next strip SP list is a sub-set of the new SP list, in that all the positions in the neighbourhood SP list are contained in the new SP list.

The previous next strip SP list comprises the column coordinates of locations of insignificant coefficients within the first row of the current strip within the 3×3 neighbourhood of coefficients in the previous strip that have been found to be significant during the SP encoding step 314.

After commencement, the SP coding step 314 proceeds to an initialisation step 704, where the entries for the neighbourhood SP list, the current next strip SP list, the previous next strip SP list, and the new SP list are reset to zero (0). After the initialisation step 704, the sub-procedure proceeds to decision block 706, where a check is made whether there any positions in the original SP list. If the decision block 706 returns No (FALSE), the SP coding step 314 terminates 714 and the entropy coding method proceeds to the MR coding step 316. This may occur when all the positions within the code block are significant and are to be coded during the MR coding step 316. If the decision block 706 returns Yes (TRUE), the SP coding step 314 simultaneously proceeds to a loop (steps 710 to 728) and a cleanup list generation step 708. The cleanup list generation step 708 generates the cleanup list at the same time as the SP coding step 314 is coding the SP positions and generating the above-mentioned SP lists. The cleanup list generation step 708 will be described in more detail below.

The loop (710 to 728) processes each position in the original SP list, the neighbourhood SP list, and the previous next strip SP list, for each pass of the loop. During any pass of the loop, the SP coding step 314 retrieves 720 the next position in the original SP list, the neighbourhood SP list, and the previous next strip SP list, which has not been previously retrieved during a previous pass. The positions in these lists are retrieved during one pass of the loop after another in accordance with JPEG2000 scanning order. The manner in which these positions are retrieved will be described in below in more detail with reference to FIG. 8. Otherwise, if there are no more positions within these lists that have not been previously retrieved, the SP coding step 314 exits the loop (steps 710 to 728) and proceeds to step 712.

After the completion of the initialisation step 704, the SP coding step 314 proceeds to a decision block 706, where a check is made whether there is any more positions in the in the original SP list, the neighbourhood SP list, and the previous next strip SP list. If there are remaining positions within these lists, the decision block returns Yes (TRUE) and the SP coding step 314 proceeds to decision block 710.

The decision block 716 checks whether there are any more positions in the current strip of the code block in the original SP list, the neighbourhood SP list, and the previous next strip SP list that have not been previously retrieved. The SP coding step 314 processes the strips of the code block commencing at the first strip and continues through to the last strip in the scanning order described in the JPEG2000. During the initial pass of the decision block 716 the current strip is the first strip of the code block. If the decision block 716 returns No (FALSE), the SP coding step 314 proceeds to step 718, where the column positions in the current next strip SP list are output to the previous next strip SP list, and the entries of the current next strip SP list set to zero. As mentioned before, the current next strip SP list comprises the column coordinates of locations of insignificant coefficients within the first row of the next strip within the 3×3 neighbourhood of coefficients in the current strip that have been found to be significant during the SP coding step 314. The previous next strip SP list comprises the column coordinates of locations of insignificant coefficients within the first row of the current strip within the 3×3 neighbourhood of coefficients in the previous strip that have been found to be significant during the SP coding step 314. The SP coding step 314 adds (step 738) column numbers to the current next strip SP list and retrieves column numbers from the previous next strip SP list during the SP encoding processing of any strip of the code block. If there are no more positions within the current strip, the column numbers of the current next strip SP list are output 718 to the previous next strip SP list and the entries of current next strip SP list set to zero, and the next strip becomes the current strip. After the completion of step 718, the SP coding step 314 proceeds to step 720.

If on the other hand, the decision block 716 returns Yes (TRUE), the SP coding step 314 proceeds directly to step 720. During step 720, the SP coding step 314 retrieves the next position in the original SP list, the neighbourhood SP list, and the previous next strip SP list, which has not been previously retrieved during a previous pass of the loop, as will be explained in more detail below with reference to FIG. 8. After completion of step 720, the SP coding step 314 proceeds to step 722, where context generation and coding of the bit symbol at that (retrieved) position is performed. The coding and context generation is preferably performed in accordance with the JPEG2000. After completion of the coding, the step 722 also updates the significance table, if required. The significance state of a coefficient transitions to one (1) when the coefficient's first non-zero bit-plane value is encoded and the corresponding entry of the array of the table is reset to one (1). Specifically, if the current coded bit symbol belonging to a coefficient is one (1) the significance for that coefficient stored in the significance table is set to one (1).

After completion of the coding step 722, the SP coding step 314 proceeds to decision block 724. In decision block 724, a check is made whether the encoded bit symbol at that (retrieved) position has a significance state of one (1). If the decision block 724 returns No (FALSE), the SP coding step 314 returns to step 710, where the next position in the original SP list, the neighbourhood SP list, and the previous next strip SP list, which has not been previously retrieved during a previous pass of the loop, is retrieved. On the other hand, if the decision block 724 returns Yes (TRUE), the SP coding step 314 proceeds to step 726, where the flag of the corresponding (retrieved) position in the original list or new SP list is tagged as being significant. In this way, this position is identified for subsequent addition to the MR list during the next cleanup encoding step 318.

After completion of step 726, the SP coding step 314 passes 732 the (row, column) coordinates of this insignificant neighbour to a process for adding the insignificant neighbours to the new SP as will be described in more detail with reference to FIGS. 13A and 13B. This process commences at the start of the SP coding step 314 and terminates at the completion of the SP coding step 314.

After completion of step 726, the SP coding step 314 also proceeds to a sub-loop 728 to 738,740, where the insignificant coefficients in the 3×3 neighbourhood of the current significant coefficient comprising the current coded bit symbol are processed in turn for each pass of the sub-loop. The sub-loop 728 to 738,740 comprises a decision block 728, where a check is made whether there exists any such insignificant neighbours of the current significant coefficient that have not been previously processed by the sub-loop. The decision block 728 makes this determination with reference to the Significance Table. If the decision block 728 returns No (False), the SP coding step 314 returns to decision block 710 for further processing. On the other hand, if the decision block 728 returns Yes (TRUE), the SP coding step 314 proceeds to step 730, where the position of the insignificant neighbour as (row, column) coordinates is retrieved from the significance table. After the completion of step 730, the SP coding step 314 proceeds to decision block 734, where a check is made whether the position of the current insignificant neighbour is after the position of the coefficient comprising the current coded bit symbol in the JPEG2000 scanning order. If the decision block 734 returns No (FALSE), the SP coding step 314 returns to decision block 728 for further processing. On the other hand if the decision block 734 returns Yes (TRUE), the SP coding step 314 proceeds to decision block 736, where a check is made whether the current insignificant neighbour belongs to the next strip after the current strip to which the current coded bit symbol belongs. If the decision block 736 returns Yes (TRUE), then the SP coding step 314 proceeds to step 738, where the column number of the position of the current insignificant neighbour is added to the end of current next strip SP list. After completion of step 738, the SP coding step 314 returns to decision block 728 for further processing. On the other hand, if the decision block 738 returns No (FALSE), then the SP coding step 314 proceeds to step 740, where the (row, column) coordinates of the position of the current insignificant neighbour is added to the end of neighbourhood SP list. After completion of step 740, the SP coding step 314 returns to decision block 728 for further processing.

Figure 8:
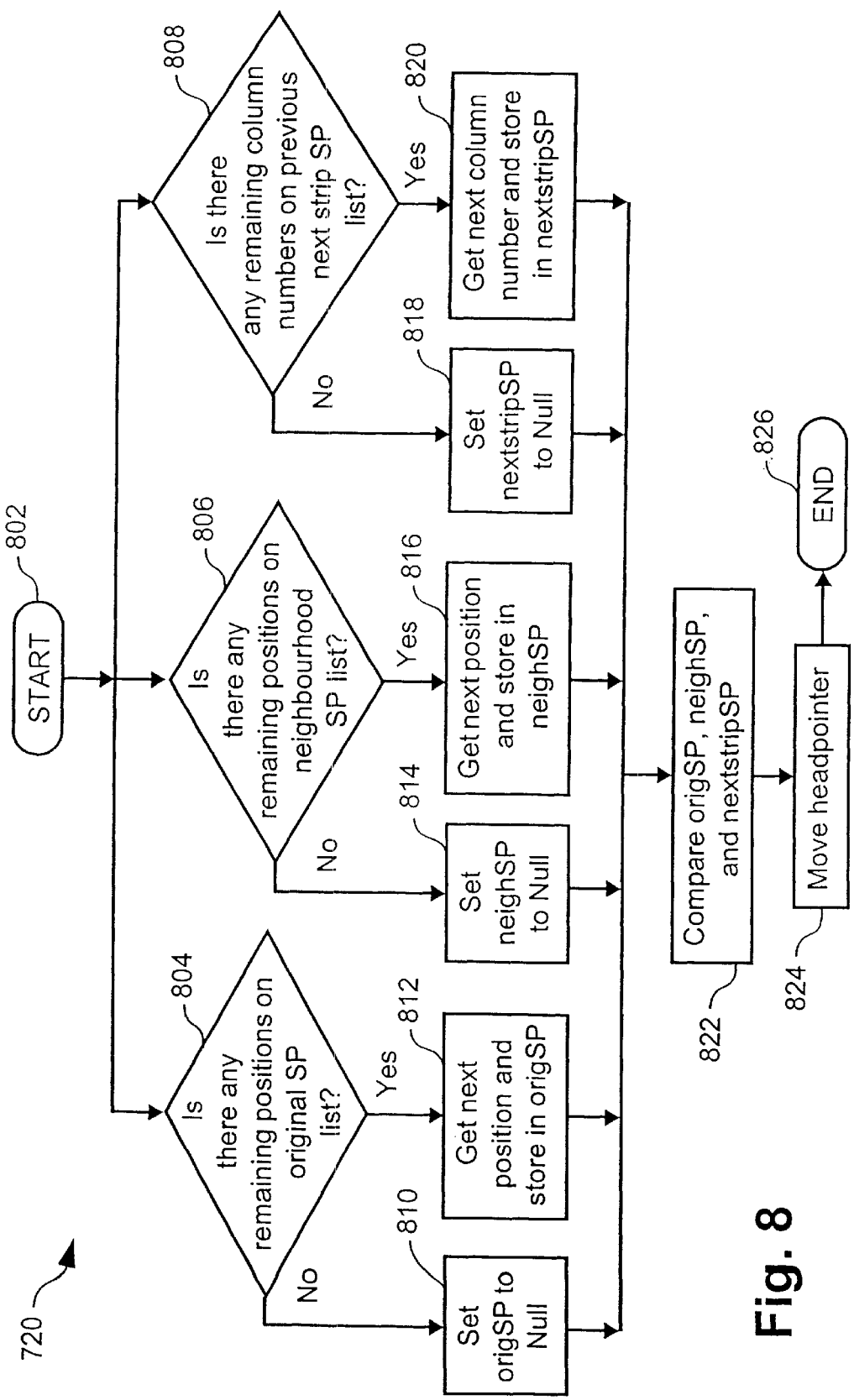
FIG. 8 shows a flow chart of the step 720 of the SP coding step 314 in more detail.

Turning now to FIG. 8, there is shown a flow chart of the step 720 of the SP coding step 314 in more detail. The step 720 retrieves the first position, according to the JPEG2000 scanning order, stored in the original SP list, the neighbourhood SP list, or the previous next strip SP list, which has not been previously retrieved and processed. As will be apparent from above, the positions stored in the original SP list, the neighbourhood SP list, and the previous next strip SP list, are ordered according to the JPEG2000. During the first call to step 720, three headpointers respectively point to the first entry in the original SP list, to the first entry in the neighbourhood SP list, and to the first entry in the previous next strip SP list. For each subsequent call, one of these headpointers will move to the next entry in the list. In the event step 718 outputs the contents of the current next strip SP list to the previous next strip SP list, the headpointer for the previous next strip SP list is reset to the first entry in the previous next strip SP list. The positions of the headpointers are maintained between each call to step 720 for the current SP entropy step 314. The headpointers are reset once the current SP entropy step 314 is completed.

The step 720 commences at step 802 and proceeds simultaneously to decision blocks 804, 806, and 808. In decision block 804, step 720 checks whether the headpointer points to a valid (ie. not null) position in the original SP list. If the decision block 804 returns Yes (TRUE), the step 720 proceeds to step 812, where the step 720 retrieves the (row, column) coordinates of that position in the original SP list to which the headpointer points and stores it in a variable origSP. On the other hand, if the decision block 804 returns No (FALSE), the step 720 sets the variable origSP to null. In decision block 806, step 720 checks whether the headpointer points to a valid (ie not null) position in the neighbourhood SP list. If the decision block 806 returns Yes (TRUE), the step 720 proceeds to step 816, where the step 720 retrieves the (row, column) coordinates of that position in the neighbourhood SP list to which the headpointer points and stores it in a variable neighSP. On the other hand, if the decision block 806 returns No (FALSE), the step 720 sets the variable neighSP to null. In decision block 808, step 720 checks whether the headpointer points to a valid (ie not null) position in the previous next strip SP list. If the decision block 808 returns Yes (TRUE), the step 720 proceeds to step 820, where the step 720 retrieves the column number of that position in the previous next strip SP list to which the headpointer points. This column number is stored as coordinates (1, column number) in a variable nextstripSP. As mentioned above, the previous next SP list stores the column numbers of any insignificant neighbours in the first row of a strip due to significant coefficients coded during the SP coding step 314 of the previous strip. On the other hand, if the decision block 808 returns No (FALSE), the step 720 sets the variable nextstripSP to null.

After the completion of steps 810 to 820, the step 720 proceeds to step 822. During step 822, the location of the positions stored in the variables origSP, neighSP, and nextstripSP are compared to find that position of these three positions, which is first in the JPEG2000 scanning order. After completion of step 822, the step 720 proceeds to step 824, where the headpointer to the entry containing this 'first' position is moved one entry along, away from the first entry, in the corresponding list. The 'first' position obtained by the comparison step 822 is then passed to the coding step 722 and the cleanup list generation step 708 of the SP coding step 314 for further processing. The step 720 then terminates.

At the same as the SP coding step 314, is performing steps 710 to 740, the SP coding step 314 is performing a cleanup list generation step 708, which will be described in more detail below.

Figure 13A:
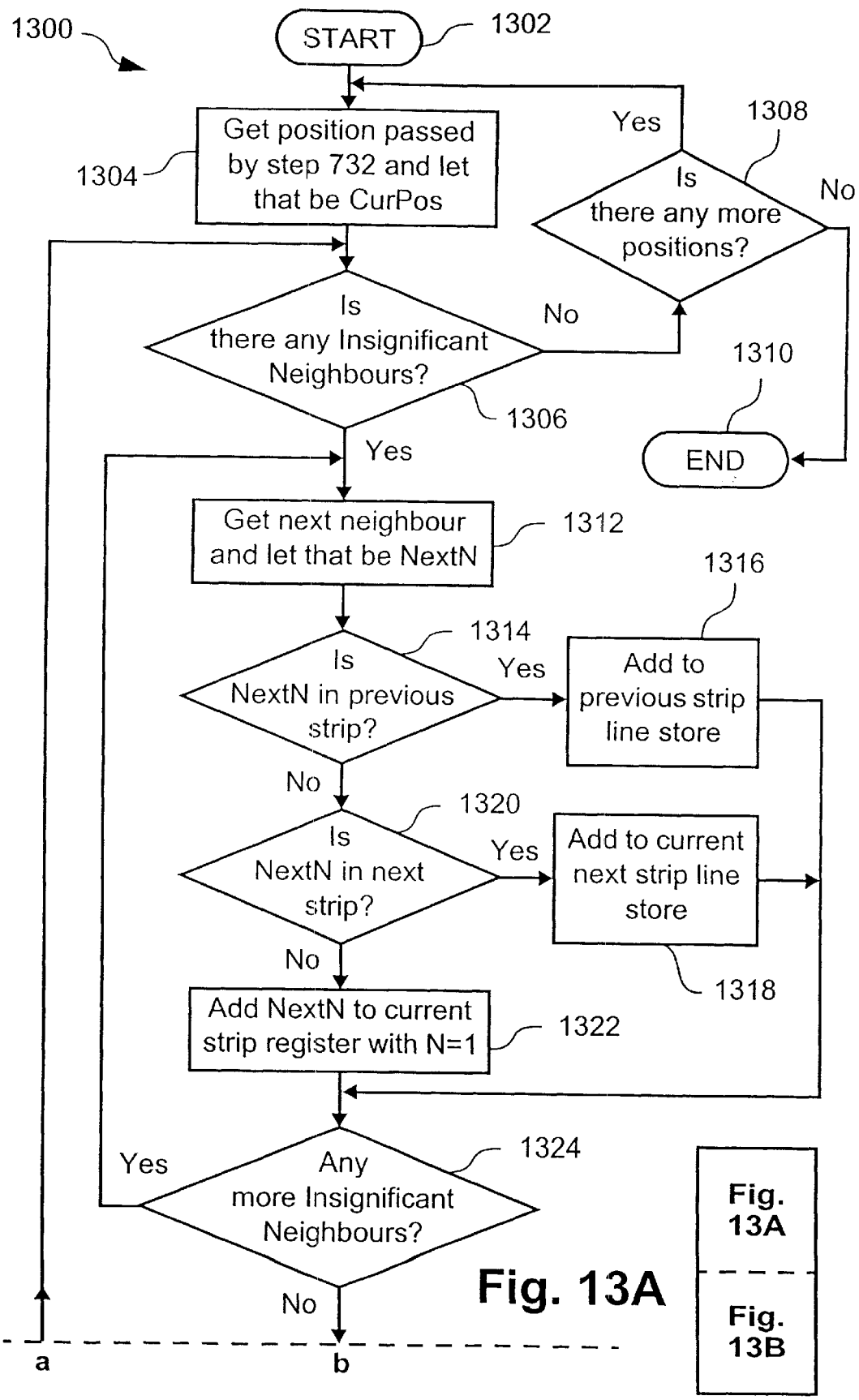
FIGS. 13A and 13B shows a flow chart of the process of adding the insignificant neighbours to the new SP list passed by step 732 of FIG. 7A.
Figure 13B:
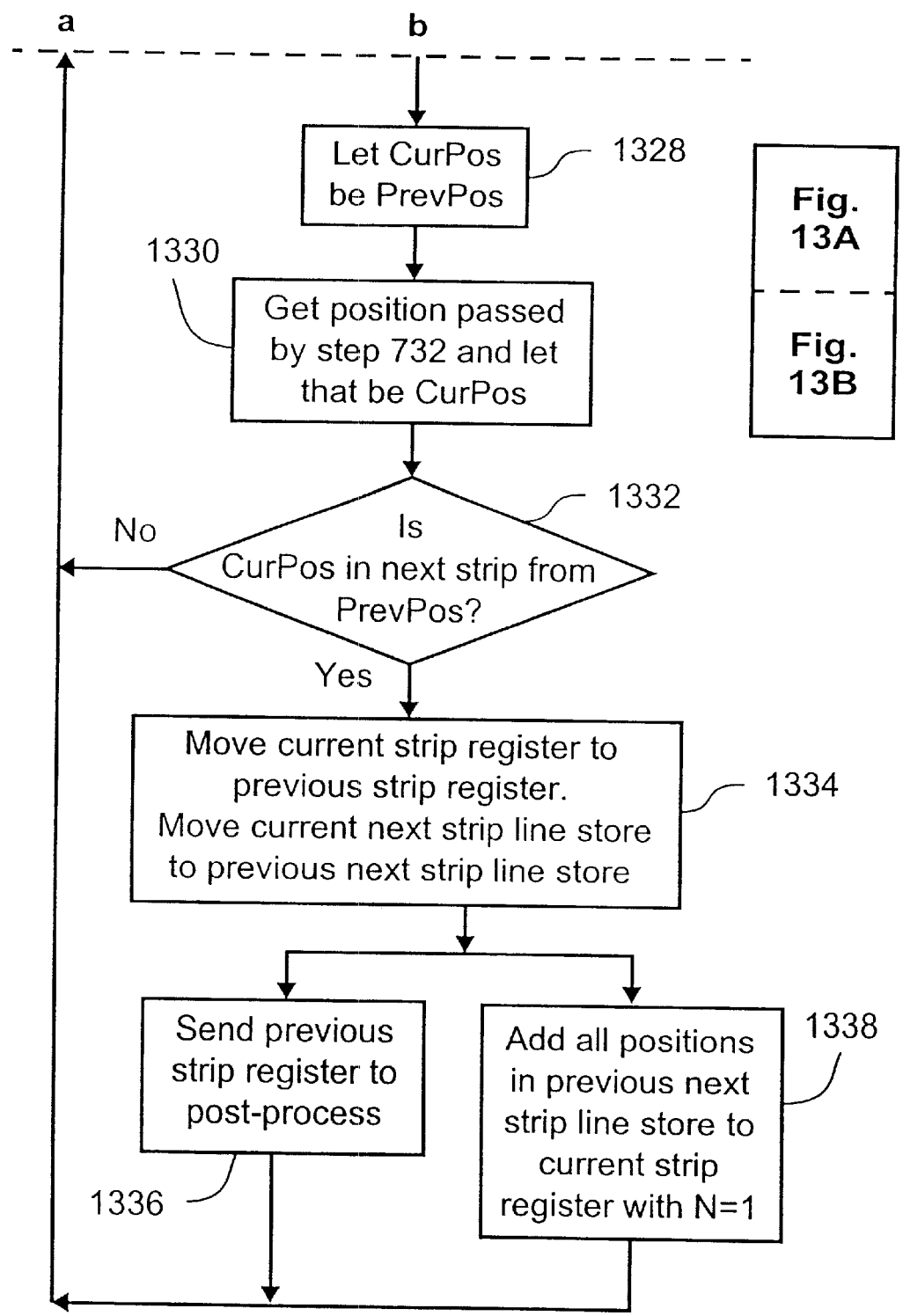

Turning now to FIGS. 13A and 13B, there is shown a flow chart of the process of adding the insignificant neighbours to the new SP list. The SP coding step 314 passes during step 732 (FIG. 7A) the (row, column) coordinates of the insignificant neighbours of those coefficients which have been found to be significant during the SP coding pass 314. These positions are passed to a process 1300 for adding the insignificant neighbours to the new SP list. This process 1300 commences at the start of the SP coding step 314 and terminates at the completion of the SP coding step 314. The purpose of this process 1300 is to remove any overlaps of insignificant neighbours of significant coefficients. For example, there may exist a coefficient which is a insignificant neighbour of two significant coefficients and consequently it needs only be added once to the new SP list. These insignificant neighbours are added to the new SP list in such a manner that they are ordered in the SP list in the JPEG2000 scanning order. The process 1300 utilises the 4×N previous strip register, the 4×N current strip register, the 1×N previous next strip line store, the 1×N current next strip line store, and the 1×4N previous strip line store mentioned previously, where N is the width of the block. The process 1300 acts as pre-processing step in a somewhat similar fashion to the pre-processing step as that used in the initial cleanup coding pass 308. The process 1300 sends the contents of the previous strip register and previous strip line store to a post-processing process 1400, which is described in more detail with reference to FIG. 14. This post processing process 1400 acts in a somewhat similar fashion as the post-processing step as that used in the initial cleanup coding pass 308. For instance, whilst the process 1300 is pre-processing the ith strip the process 1400 is post-processing the (i−1)th strip.

The pre-processing process 1300 sets the N bits of the entries of the 4×N current strip register to one (1) for corresponding insignificant coefficients in the ith strip, which are within the 3×3 neighbourhood of significant coefficients in the same strip. The pre-processing process

1300 also stores, in the previous strip line store, the column numbers of insignificant coefficients which are in the last row of the (i−1)th strip and which are in the 3×3 neighbourhood of significant coefficients of the first row of the ith strip. Once the ith strip has been pre-processed it is sent to the process 1400 for post-processing. The process 1400 also fetches the entries in the previous strip line store that are currently being added to it during the pre-processing of the (i+1)th strip. Namely, the post-processing process 1400 fetches in turn the column numbers of insignificant coefficients which are in the last row of the ith strip and which are in the 3×3 neighbourhood in significant coefficients of the first row of the (i+1)th strip.

The process 1300 commences at step 1302, where the entries of the above-mentioned registers and line stores are set to zero. The process 1300 then proceeds to step 1304 where the (row, column) coordinates of the significant coefficient passed during step 732 are fetched. The fetched (row, column) coordinates are stored in a variable CurPos. The process 1300 then proceeds to decision block 1306, where a check is made whether there are any insignificant coefficients in the 3×3 neighbourhood of the position stored in CurPos.

In the event the decision block 1306 returns Yes (TRUE), the process 1300 proceeds to a loop 1312 to 1324, where the insignificant neighbours in the 3×3 neighbourhood of the position CurPos are fetched in turn and processed. Specifically, the process 1300 proceeds to step 1312 where the (row, column) coordinates of the next insignificant neighbour is fetched and stored in a variable NextN. The process 1300 then proceeds to a decision block 1314, where a check is made whether the position NextN is in the previous strip to the current strip. If the decision block 1314 returns Yes (TRUE), the column number of the position NextN is added 1316 to the previous strip line store. Otherwise, the process 1300 proceeds to decision block 1320, where a check is made whether the position NextN is in the next strip to the current strip. In the event the decision block 1320 returns Yes (TRUE), the column number of the position NextN is added 1318 to the current next strip line store. On the other hand, if the decision block 1320 returns No (FALSE), the process 1300 sets the bit N to one (1) for the entry in the current strip register corresponding to the position NextN. After the completion of steps 1316, 1318, or 1322, the process 1300 proceeds to decision block 1324. In decision block 1324, a check is made whether there are any more insignificant neighbours. If the decision block 1324 returns Yes (TRUE), the process 1300 returns to step 1312 for further processing of the next insignificant neighbour. Otherwise, the process continues to step 1328.

In step 1328, a variable PrevPos is set to the variable CurPos. The process 1300 then continues to step 1330, where the process 1300 fetches the (row, column) coordinates of the next position passed during step 732 (FIG. 7A). The fetched (row, column) coordinates are stored in the variable CurPos. In the event this next position is not yet available, the process 1300 waits until it becomes available. If there are no more positions available, the process 1300 proceeds directly (not shown) to step 1334.

After the completion of step 1330, the process proceeds to decision block 1332, where a check is made whether the position stored in the variable CurPos is in the next strip from the position stored in the variable PrevPos. In the event the decision block 1332 returns No (FALSE), the process 1300 returns to decision block 1306 for further processing of the new position stored in the variable CurPos. In the event the decision block 1332 returns Yes (TRUE), the process 1300 continues to step 1334.

During step 1334, the process 1300 moves the contents of the current strip register to the previous strip register and then sets entries in the current strip register to zero. The step 1334 also moves the contents of the current next strip line store in the previous next strip line store and then sets the entries in the current next strip line store to zero. After completion of step 1334, the process continues to steps 1336 and 1338 at the same time. During step 1336, the process 1300 post-processes previous strip register, which will be described in more detail with reference to FIG. 14 below. During step 1338, the process 1300 sets the bits N to one (1) for the entries in the current strip register corresponding to the positions currently stored in the previous next strip line store. After completion of steps 1336 and 1338, the process continues to decision block 1306 for processing of any more insignificant neighbours.

In the event the decision block 1306 returns No (FALSE), namely there are no insignificant neighbours, the process 1300 continues to decision block 1308. Decision block 1308 makes a check whether there are any more positionspassed by step 732 (FIG. 7A). In the event decision block 1308 returns Yes (TRUE), the process 1300 proceeds to step 1304 where that position is fetched. In the event there are no positions presently available, the decision block 1308 will wait until there is one, or the SP coding pass 314 terminates at which time the process terminates 1310.

Figure 14:
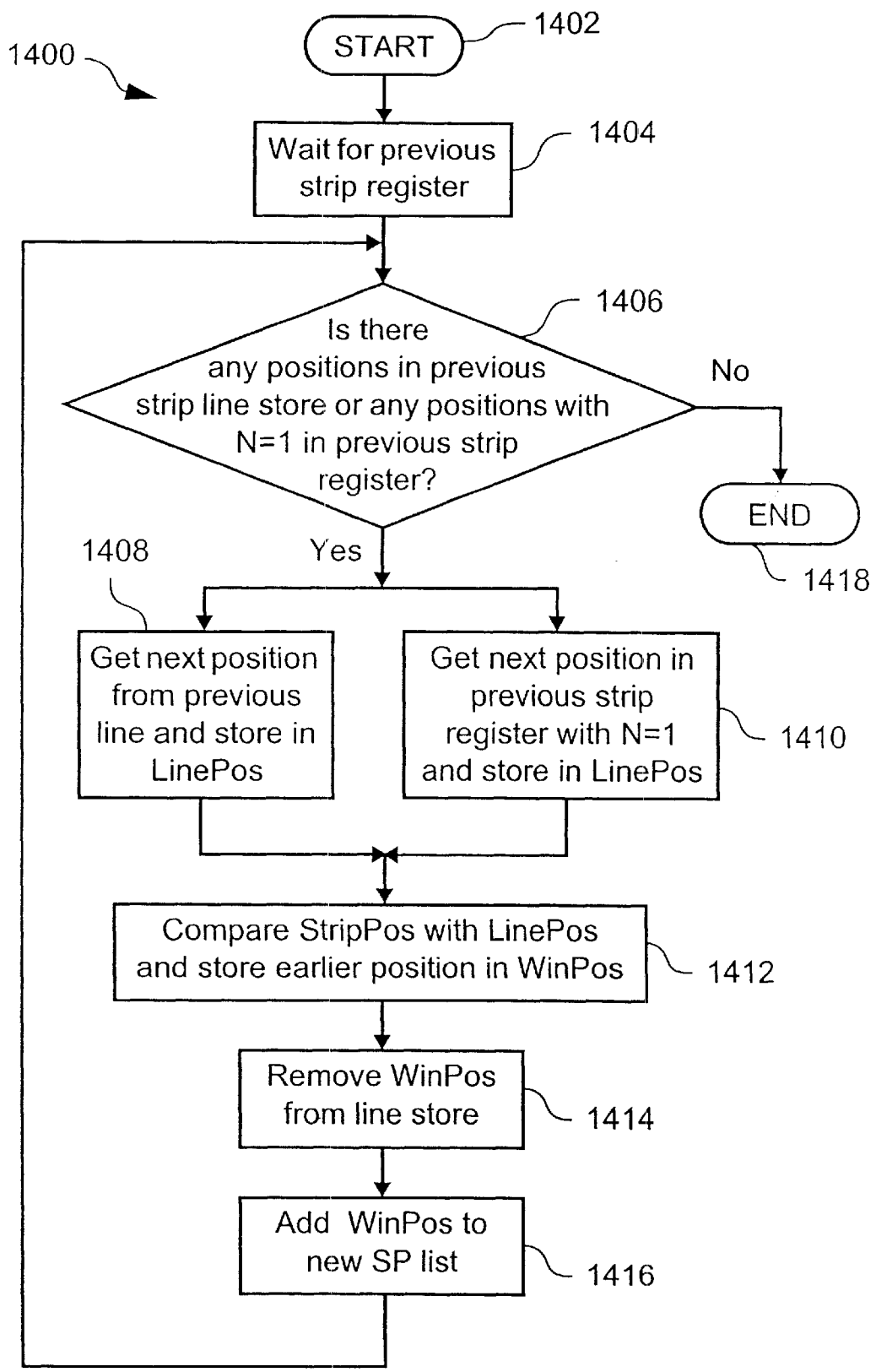
FIG. 14 shows a flow chart of the post-processing process for use with the pre-processing process of FIGS. 13A and 13B.

Turning now to FIG. 14, there is shown a flow chart of the post-processing process 1400 for use with the pre-processing process 1300 of FIGS. 13A and 13B. The post-processing step 1400 commences at the same time as the SP coding pass 314. The post-processing process 1400 commences 1402 and waits 1404 for the previous strip register passed to post-processing process 1400 during step 1336. After the post-processing process 1400 is passed the previous strip register, the process 1400 proceeds to a loop 1406 to 1416. The loop 1406 to 1416 processes in turn each entry (ie position) in the previous strip register that has a N bit set to one (1), compares that with the entry (column number) currently stored in the previous line store, and adds the earlier position in JPEG2000 scanning order to the new SP list. The loop 1406 processes the entries in the previous strip register in the JPEG2000 scanning order. As will be apparent from above, the previous line store is continually being updated during the post-processing process 1400 by the addition of entries by the pre-processing process 1300.

The loop 1406 to 1416 comprises a decision block 1406 and steps 1408 to 1416. In decision block 1406, the process 1400 checks whether there any entries (viz positions) in the previous strip register with the N bit set to 1 (one) or any positions in the previous strip line store. In the event the decision block 1406 returns Yes (TRUE), the process 1400 proceeds at the same time to steps 1408 and 1410. In step 1408, the process 1400 fetches the next (first) column number currently in the previous line store and stores that in the variable LinePos. If there is no entry currently in the previous line store the variable LinePos is set to Null. At the same time, step 1410 fetches from the previous strip register the next position in the JPEG2000 scanning order that has not has not been previously fetched and which has a N bit set to one (1), and stores that position in the variable StripPos. After steps 1408 and 1410, the process 1400 proceeds to step 1412, where the process compares the positions stored in the variables LinePos and StripPos. The step 1412 determines that position stored in the variables LinePos and StripPos, which is earlier in the JPEG2000 scanning order and stores that position in the variable WinPos. After completion of step 1412, the process proceeds to step 1414, where the position stored in the variable WinPos is removed from the previous line store, if that position is on the previous line store. After completion of step 1416, the process proceeds to step 1416, where the position stored in the variable WinPos is added to the new SP list. The process 1400 returns to decision block 1406 for further processing. In the event the decision block 1406 returns No (FALSE), the process 1400 terminates 1418.

Figure 9:
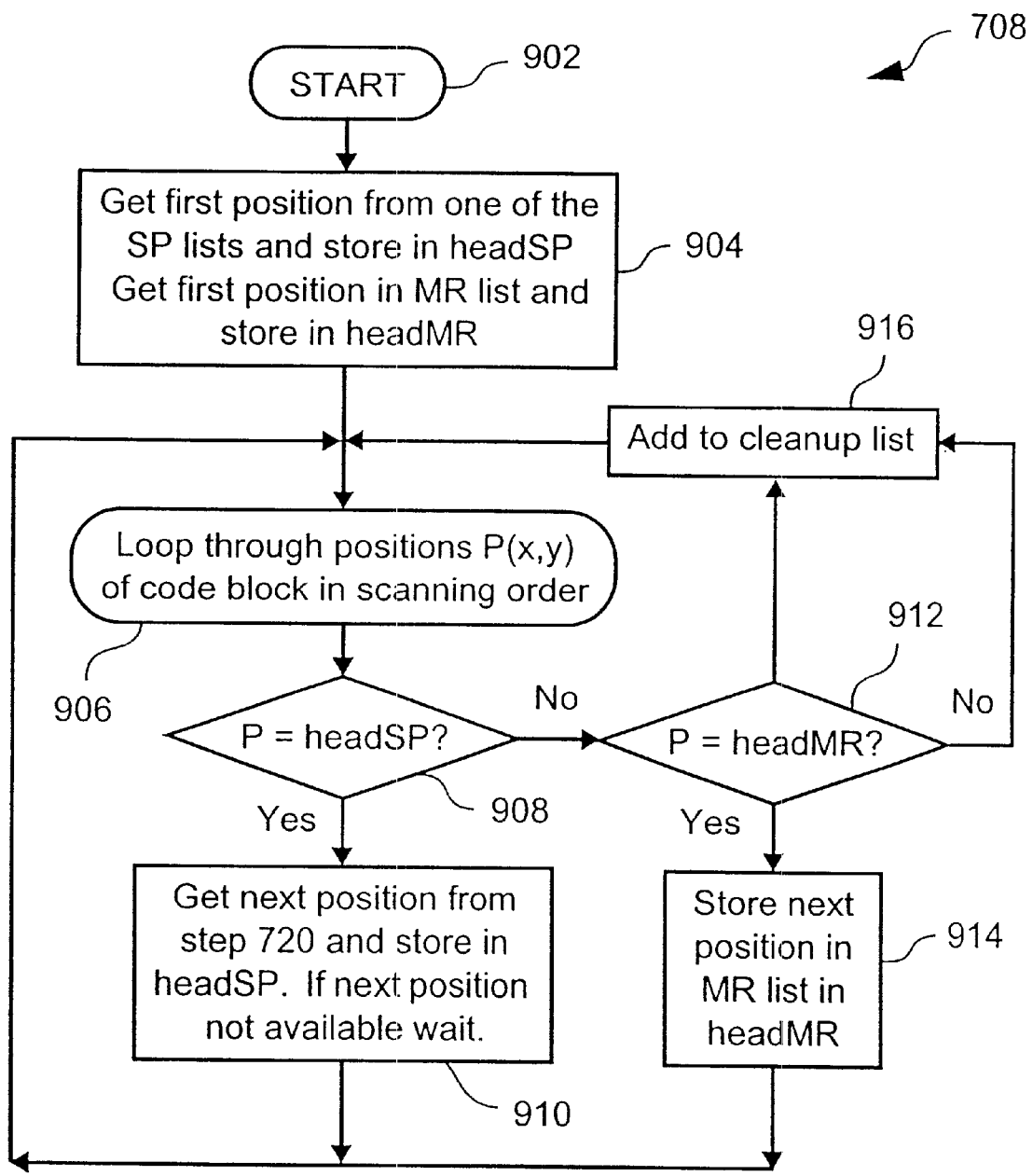
FIG. 9 shows a flow chart of the cleanup list generation step 708 of the SP coding step 314 in more detail.

Turning now to FIG. 9, there is shown a flow chart of the cleanup list generation step 708 of the SP coding step 314. The cleanup list generation step 708 commences at step 902 and proceeds to step 904, where it gets the position determined in step 720 during the first pass of the loop (710 to 740). This position is the first position, according to the JPEG2000 scanning order, stored in the original SP list, or the neighbourhood SP list, or the previous next strip SP list. This position is stored in the variable headSP. Also, the step 904 gets the first position, according to the JPEG2000 scanning order, stored in the MR list and stores this position in the variable headMR. After completion of step 904, the cleanup generation step 708 proceeds to a loop 906.

The loop 906 increments one by one through each position P(x,y) of the code block in JPEG2000 scanning order. After each increment to a new position P(x,y) of the code block, the loop 906 proceeds to decision block 908. The decision block 908 checks whether the current position P(x,y) of the loop is equal to the position stored in the variable headSP. If the decision block returns No (FALSE), the cleanup generation step 708 proceeds to decision block 912, where a check is made whether the current position P(x,y) of the loop is equal to the position stored in the variable headMR. If the decision block returns No (FALSE), the cleanup generation step 708 proceeds to step 916, where the current position P(x,y) is added to the cleanup list. After completion of step 916, the cleanup generation step 708 returns to the loop 906, where the position P(x,y) is incremented to the next position in the JPEG2000 scanning order.

On the other hand, if the decision block 908 return Yes (TRUE), the cleanup generation step 708 proceeds to step 910. During step 910, the cleanup generation step 708 gets the next position determined in step 720, if available, and stores it in the variable headSP. In this way, the cleanup generation step 708 retrieves the positions determined during the passes of step 720 one after another, and replaces the current one stored in the variable headSP with the next one with each call of step 910. Sometimes the next position is not presently available. In these circumstances, the cleanup generation step 708 will wait until it becomes available. Furthermore, if the decision block 710 (FIG. 7A) has returned No (FALSE), then the cleanup generation step 708, instead of waiting, sets the variable headSP to Null during this step 910. In the later case, there are no more positions to be coded during the SP coding step, however there may exist positions after the last position to be coded during the SP coding step that need to be added to the cleanup list. By setting the variable headSP to Null these positions can be added to the cleanup list during the subsequent passes of the loop 906. After completion of step 910, the cleanup generation step returns to loop 906 where the position P(x,y) is incremented by one in the JPEG2000 scanning order.

Furthermore, if the decision block 912 returns Yes (TRUE), the cleanup generation step 708 proceeds to step 914, where the next position in the MR list is stored the variable headMR. In this way, the cleanup generation step retrieves the positions in the MR list one after another, and replaces the current one stored in the variable headMR with the next one with each call of step 914. If there are no more positions left in the MR list, then step 912 sets the variable headMR to Null. After completion of step 914, the cleanup generation step returns to loop 906 where the position P(x,y) is incremented by one in the JPEG2000 scanning order.

The cleanup generation step 708 terminates after all the positions P(x,y) within the code block have been processed by the cleanup generation step 708.

In this way, at the same time as the as current position is being processed in the current SP pass, that position is also sent to the cleanup list generation step 708. In this step 708, there is a loop going through all the coordinates in the block in JPEG2000 scanning order. The generated coordinate will be compared with the next position in the current SP coding pass. If they are equal, then that position is processed in the current SP pass already, and the process goes on to obtain the next position in the current SP coding pass, and the process generates the next coordinate. If there is no next position from the current SP coding pass, then the process waits until there is one, or the SP coding has finished. If the current coordinate does not equal to the variable headSP, then it is before coordinate stored in the variable headSP and therefore is a candidate for the cleanup list. That coordinate is then compared with the variable headMR. If they are equal, then that coordinate is on the MR list already and so the process obtains the next position in the MR list, stores it in the variable headMR, and it generates the next coordinate. If the generated coordinate does not equal to the variable headMR, then it is inserted into the cleanup list. Once all the SP positions have been coded the variable headSP can be set to Null. Similarly, once all the MR positions on the MR list have been processed the variable headMR can be set to Null. In this manner, coordinates after the end of the SP lists and MR list can be added to the cleanup list.

In a variation of the present arrangement, if the process detects that the 4 positions in a column in a strip are all on the cleanup list then it can compress them into one combined coordinate in the cleanup list. This can then be used later in cleanup phase of the coding/decoding, when zero coding may be possible.

Returning now to FIG. 7A, during the termination step 714, the SP coding step 314 returns the new SP list and the updated original SP list for further processing during the cleanup encoding pass 318. Meanwhile the entropy coding method 300 proceeds to the magnitude refinement encoding pass 316.

Figure 10:
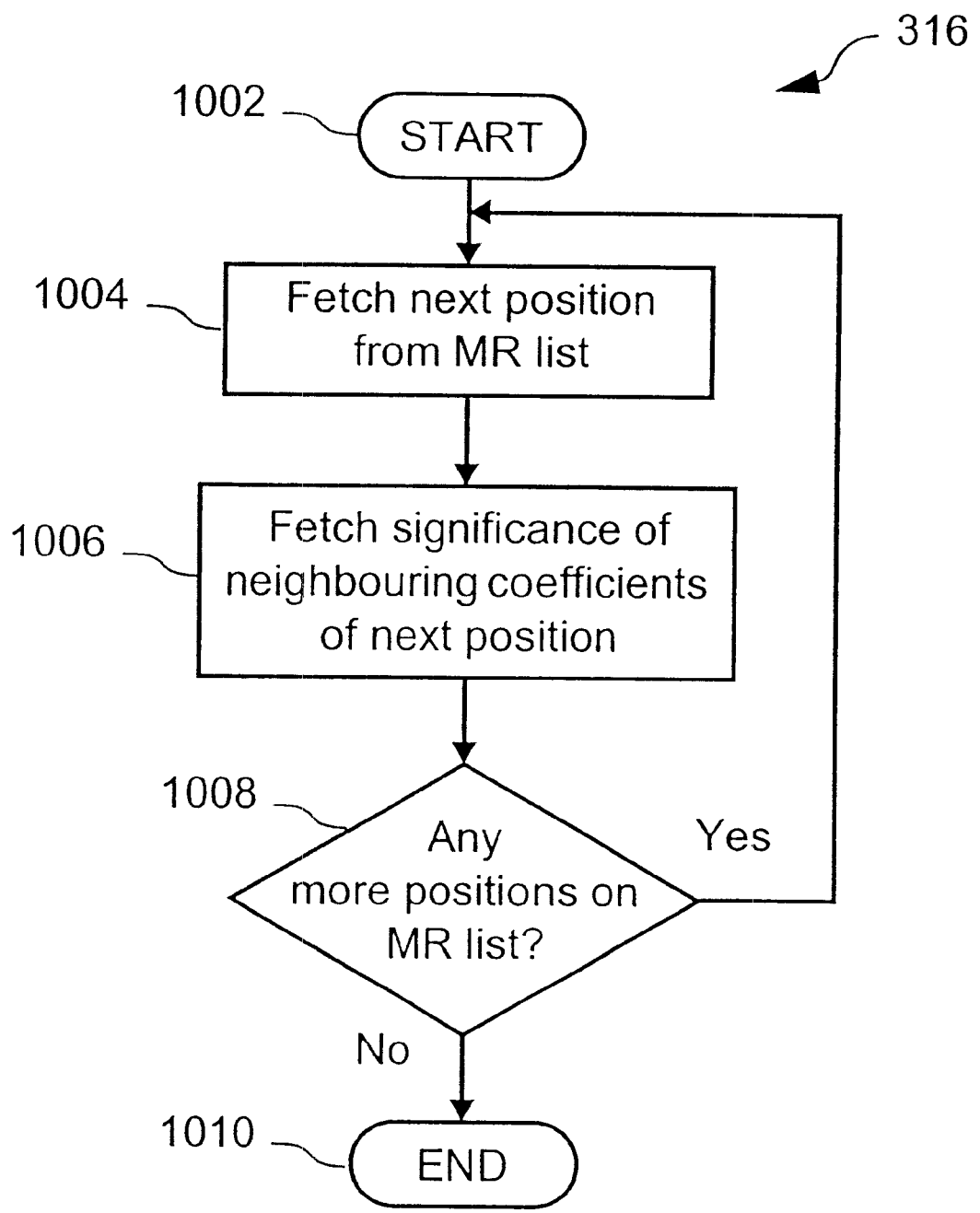
FIG. 10 shows a flow chart of the magnitude refinement coding pass 316 in more detail.

Turning now to FIG. 10, there is shown a flow chart of the magnitude refinement coding pass 316 in more detail. The magnitude refinement coding pass 316 commences at step 1002 and proceeds to a loop 1004 to 1008, where the positions in the MR list are retrieved for respective passes of the loop 1004 to 1008, in JPEG2000 scanning order. After step 1002, the magnitude refinement coding pass 316 proceeds initially to steps 1004 and 1006 of the loop for the processing of the first position in the MR list. After completion of step 1006, the magnitude refinement coding pass 316 proceeds to a decision block 1008, where a check is made whether there are any more positions on the MR list to be processed, that have not been previously processed. If the decision block 1008, returns Yes (TRUE), the magnitude refinement coding pass 316 returns to step 1004, where the next position on the MR list is retrieved. During step 1004, the magnitude refinement coding pass 316 fetches the current position from the MR list, and uses this current position to fetch a corresponding symbol from memory. It also fetches from the significance table the significance of the coefficients in the 3×3 neighbourhood of the current position. After the completion of step 1004, the magnitude refinement coding pass 316 proceeds to step 1006. During step 1006, these significances are then fed to the context generation process to generate a context for the coding of the corresponding symbol and that symbol is then arithmetically coded. These steps 1004 and 1006 can be performed at a rate of one position per cycle. In the coding process, the coordinate of the position is used to fetch the required data bit from the bit plane memory. In the decoding process, the coordinate of the position is used to write the decoded bit into an output buffer. If the decision block 1008, returns No (FALSE), the magnitude refinement coding pass 316 will terminate 1010 and the method of entropy coding will then proceed to the cleanup coding pass 318.

Figure 11:
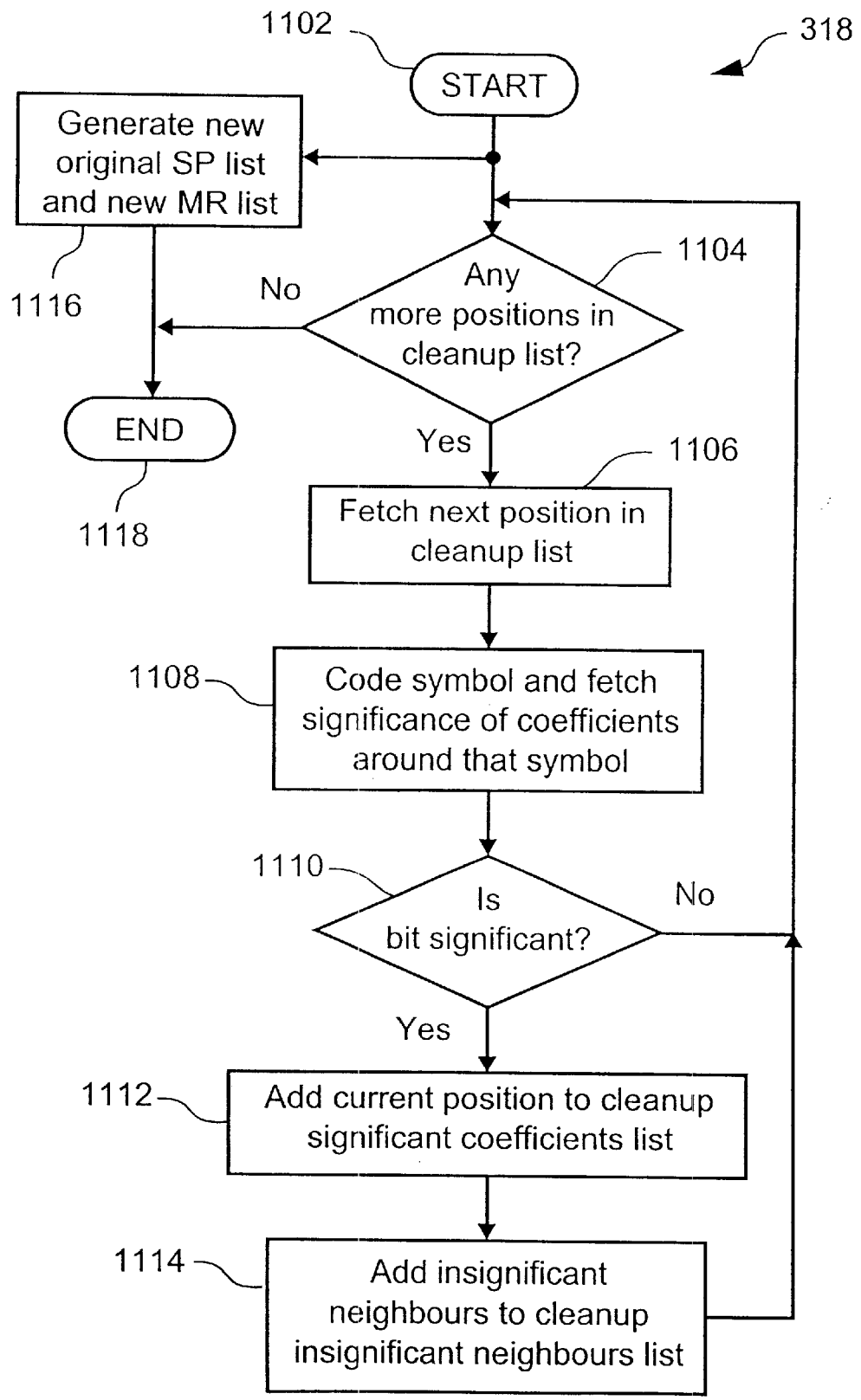
FIG. 11 shows a flow chart of the cleanup coding pass 318 in more detail.

Turning now to FIG. 11, there is shown a flow chart of the cleanup coding pass 318. The cleanup coding pass 318 commences at step 1102. During this step 1102, the cleanup list generated during the previous significance propagation coding pass 314 is passed to the current cleanup coding pass 318. Also, the original SP list generated during the previous cleanup coding pass 308 or 318 and updated during the previous SP coding pass 314 is passed to the cleanup coding pass 318. Furthermore, the new SP list generated during the previous SP coding pass 314 is also passed to the cleanup coding pass 318. During the commencement step 1102, the cleanup coding pass 318 also initiates two lists called cleanup-significant coefficients list and cleanup-insignificant neighbours list for storing (row, column) coordinates of positions, and sets the entries of those lists to Null. Lastly, the MR list generated during the previous cleanup coding pass 308 or 318 is passed to the current cleanup coding pass 318.

After the commencement step 1102, the cleanup coding pass 318 proceeds to a loop 1104 to 1114, where the positions in the cleanup list are retrieved during respective passes of the loop 1104 to 1114, in JPEG2000 scanning order. After step 1102, the cleanup coding pass 318 proceeds to a decision block 1104, where a check is made whether there are any more positions in the cleanup list, not previously retrieved by the current cleanup coding pass 318. If the decision block 1104 returns Yes (TRUE), then the cleanup coding pass 318 proceeds to step 1106, where the next position in the cleanup list that has not been previously retrieved is fetched. The positions are retrieved from the cleanup list in JPEG2000 scanning order. After this position has been fetched, the cleanup coding pass 318 proceeds to step 1108. During step 1108, the cleanup coding pass 318 uses this current position to fetch the corresponding bit symbol from bit plane memory at that position. It also fetches from the significance table the significance of the coefficients in the 3×3 neighbourhood of the current position. Furthermore, these significances are then fed to a context generation process to generate a context for the coding of the current symbol, which symbol is then arithmetically coded.

After completion of step 1108, the cleanup coding pass 318 proceeds to decision block 1110, where a check is made whether the current bit symbol coded is significant. If the decision block 1110, returns No (FALSE), the cleanup coding pass 318 returns to decision block 1104 for processing of the next position in the cleanup list if any. On the other hand, if the decision block 1110 returns Yes (TRUE), the cleanup coding pass proceeds to step 1112, where the (row, column) coordinates of the current position is added to the cleanup-significant coefficients list. The positions in the cleanup-significant coefficients list are stored in JPEG2000 scanning order. After completion of step 1112, the cleanup coding pass 318 proceeds to step 1114.

During step 1114, the cleanup coding pass 318 determines those coefficients within the 3×3 neighbourhood of the current position that are insignificant, and adds the positions of these insignificant neighbours to the cleanup-insignificant neighbours list. The latter positions in the cleanup-insignificant neighbours list are also sorted according to JPEG2000 scanning order. As will be apparent to a person skilled in the art, the cleanup-insignificant neighbours list may comprise positions of coefficients that are not on the cleanup list itself. The manner in which these insignificant coefficients are added to the cleanup-insignificant neighbours list is similar to that described with reference to addition of insignificant coefficients to the new SP list (FIGS. 13A, 13B and 14). In the former case, the cleanup coding pass 318 uses the same processes as described with reference to FIGS. 13A, 13B, and 14 with the following modifications. The (row, column) coordinates of the significant coefficient currently coded by the cleanup coding pass 318 is passed during step 1114 to step 1304 (FIG. 13A), and in step 1414 the variable WinPos is instead added to the cleanup-insignificant neighbours list. In this way, any overlaps of insignificant coefficients are removed.

After completion of step 1114, the cleanup coding pass 318 codes (not shown) the sign bit in accordance with the JPEG2000 and then returns to decision block 1104. If the decision block 1104 returns No (FALSE), namely there are no more positions on the cleanup list that have been retrieved and processed, the cleanup coding pass 318 proceeds to step 1116, where the cleanup coding pass 318 terminates.

At the same time as the cleanup coding pass 318 is processing each position on the cleanup list, the cleanup coding pass generates 1116 a new original SP list and a new MR list for subsequent processing during the next SP coding pass 314 and MR coding pass 316.

Figure 12:
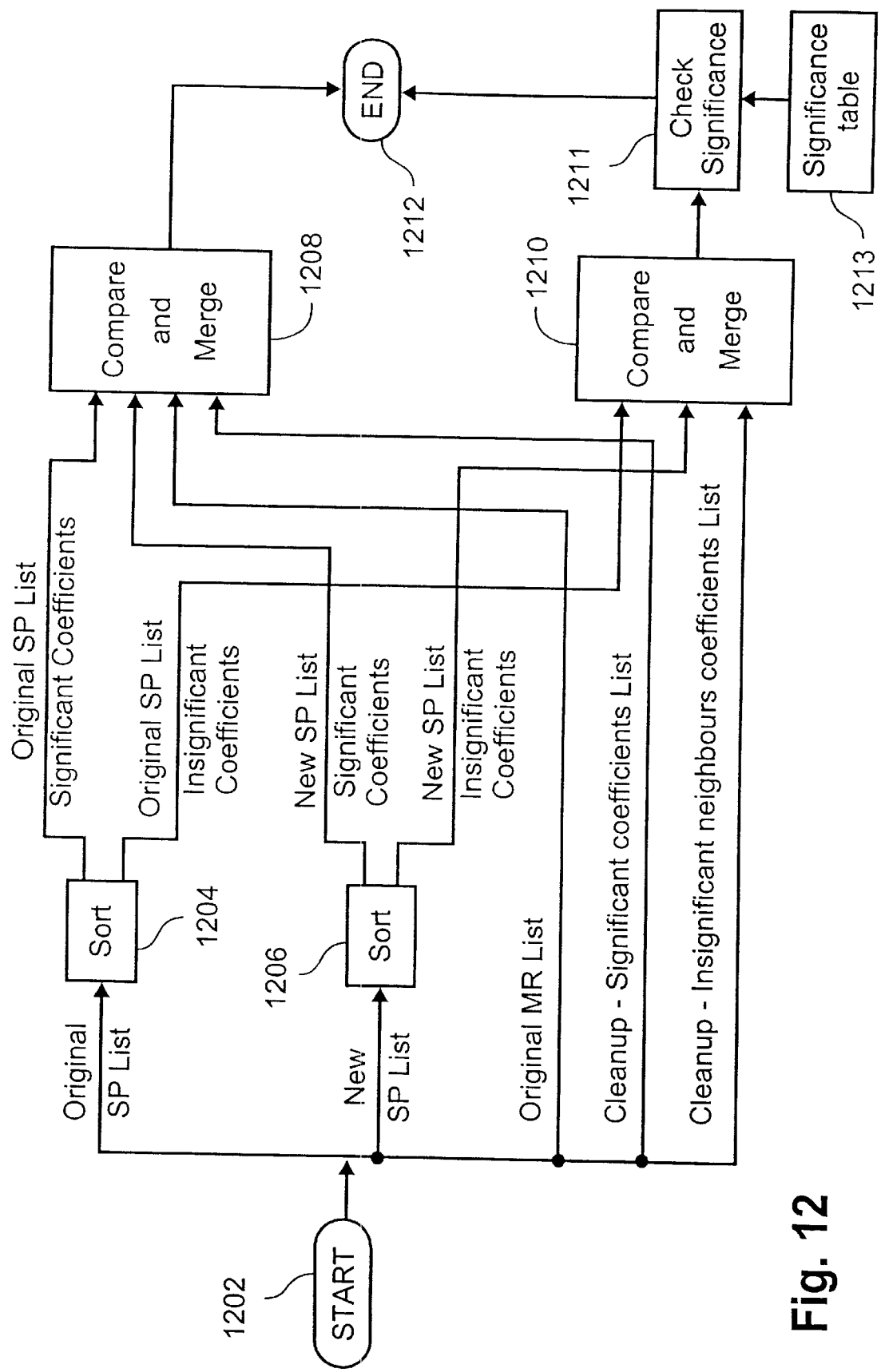
FIG. 12 shows a flow chart of step 1116 for generating a new original SP list and a new MR list in more detail.

Turning now to FIG. 12, there is shown a flow chart of step 1116 for generating a new original SP list and a new MR list in more detail. The step 1116 commences at 1202, where the updated original SP list, New SP list, original MR list, cleanup-significant coefficient list, and cleanup-insignificant neighbours list are input. The original SP list in the list memory is sorted 1204, using the significance tags updated during the previous SP coding step 314, into two lists. A original SP-significant coefficient list comprising those positions of the original SP list, which have been tagged as having corresponding significant coefficients in the current bitplane. The latter positions are to be added to the new original MR list. A original SP-insignificant coefficient list comprising those positions of the original SP list whose tags indicate the positions have corresponding insignificant coefficients in the current bitplane. The latter positions are to be added to the new original SP list. Similarly, the new SP list is sorted 1206, using the significance tags generated during the previous SP coding step 314, into two lists. A new SP-significant coefficient list comprising those positions of the new SP list, which have been tagged as having corresponding significant coefficients in the current bitplane. The latter positions are to be added to the new MR list. A new SP-insignificant coefficient list comprising those positions of the new SP list whose tags indicate the positions have corresponding insignificant coefficients in the current bitplane. The latter positions are to be added to the new SP list.

The positions of the original SP-insignificant coefficient list, original SP-significant coefficient list, the new SP-insignificant coefficient list, the new SP-significant coefficient list, the original MR list, the cleanup-significant coefficient list, and the cleanup-insignificant neighbours list then go through two identical 'compare-and-merge' processes 1208 and 1210 that merge all the sub-lists together. The first 'compare-and-merge' process 1208 compares and merges the positions of the original SP-significant coefficient list, the new SP-significant coefficient list, the original MR list, and the cleanup-significant coefficient list (herein after called the first sub-lists). The second 'compare-and-merge' process 1210 compares and merges the positions of the original SP-insignificant coefficient list, the new SP-insignificant coefficient list, and the cleanup-insignificant neighbours list (herein after called the second sub-lists). The 'compare-and-merge' processes 1208 and 1210 also receive as input the current position of the cleanup list that is currently being processed by the loop 1104 to 1114 of the cleanup coding step 318.

The 'compare-and-merge' process 1210 accepts one position from each one of the second sub-lists, and compares them to see which is the earliest in the JPEG2000 scanning order. It then outputs that to step 1211, and then accepts the next position from the chosen sub-list. If two sub-lists have the same position then both are eliminated and only one is outputted. The 'compare-and-merge' process 1208 performs in a similar manner to the 'compare-and-merge' process 1210, but accepts the positions from the first sub-lists. This sorting process should be able to generate at least one position per list per clock cycle, so the throughput still remains at 1 coefficient/bit per cycle. However, all these 'compare-and-merge' processes will stall if the current coordinate processed by the loop 1104 to 1114 is before the coordinate that they are going to output. This prevents any missing coordinates in the new original SP and MR lists.

There may exist positions of insignificant coefficients on the second sub-lists, which are in fact significant. These are removed from the output of the compare and merge process 1210 during step 1211. During this step 1211, each position output by the compare and merge process 1210 is compared against the current significance state of the corresponding coefficient at that position in the Significance Table 1213. If the Significance Table 1213 indicates that the coefficient in question is significant then the position of the supposedly insignificant coefficient is removed during 1211. On the other hand, if the significance Table 1213 indicates that the coefficient in question is insignificant then the position output by the compare and merge process 1210 is not removed and forms part of the new original SP list.

The compare significance step 1211 and the compare and merge process 1208 respectively output the new original SP list and the new original MR list, which are used during subsequent SP coding pass 314 and MR coding pass 316. The step 1116 for generating the new original SP and MR lists terminates 1212 after the completion of the lists.

In a variation of the existing arrangement, the new original SP/MR list generation process can continue into the SP coding pass 314 of the next bit plane. By the time the next SP coding pass 314 commences, the head of the new original SP list should be ready, so no stalling is required. However, the generation should proceed at maximum rate because there will be no stalling from cleanup coding pass processing.

In a further variation of the existing arrangement, the tags of the original SP list and the new SP list may be dispensed with. These lists can be sorted during the list generation step 1116 by reading the significance of the coefficients corresponding to the positions stored in these lists from the significance table, which indicates whether it is significant in the current bit plane. A further variation is to have a bit in the list memory to say whether a bit is significant or not, and this bit is written when that coefficient was processed before. This approach is preferred because it reduces accesses to the significance table. That bit can be in the same memory as the lists memory or in a separate piece of memory.

As mentioned above, after completion of the cleanup coding pass 318, the method returns to decision block 310 for processing of any further bit planes. If the decision lock returns true (YES), that is there are no more bit planes to be processed, then the method terminates 300.

Figure 15:
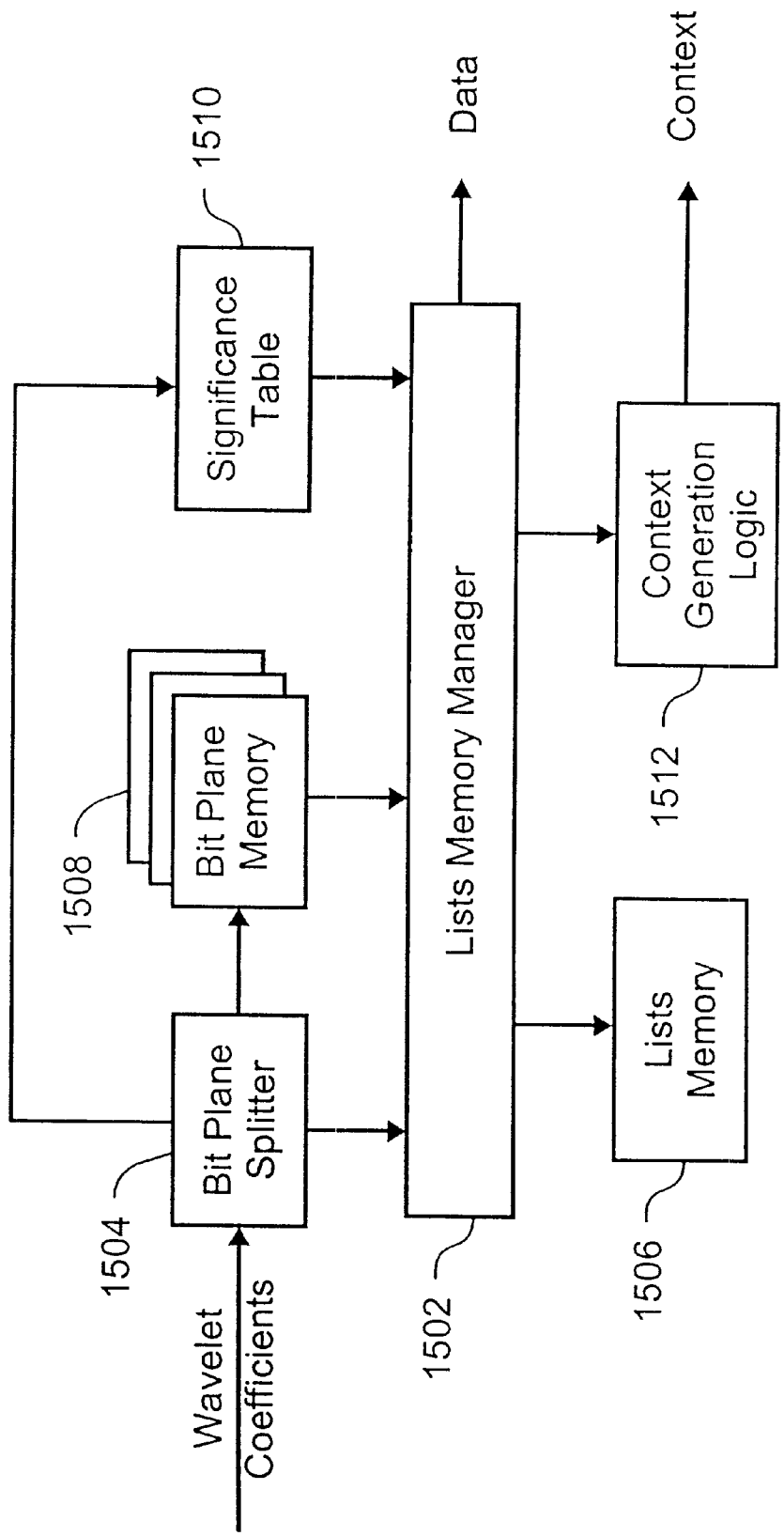
FIG. 15 shows a schematic diagram of an entropy codec for implementing the entropy coding method as shown in FIG. 3.

Turning now to FIG. 15, there is shown an entropy codec for implementing the entropy coding method shown in FIG. 3. The entropy codec comprises a list memory manager 1502, a bit plane splitter 1504, bit plane memories 1508, a significance table 1510, a list memory 1506, a context generation logic 1512, and an arithmetic coder (not shown). The list memory manager 1502 is the form of dedicated integrated circuitry, whose function is to implement the list creation and associated operations of the entropy coding method of FIG. 3. These lists created by the list memory manager 1502 (eg. the new SP list) are stored in the lists memory 1506, which is in the form of semiconductor memory, for further processing by the list memory manager 1502. The list memory manager 1502 does not perform the context generation and coding steps of the entropy coding method of FIG. 3 itself, but controls these operations, which are performed by the context generation circuit logic 1512 and a coder (not shown). Similarly, the lists memory manager 1502 does not perform the bit plane splitting operation 304 and operation 306 itself, but controls these operations which are performed by the bitplane splitter 1504.

The codec 1500 implements the entropy coding method of FIG. 3 as follows. As the wavelet coefficients of a code block are input from the DWT unit (not shown), the bit planes constituting this code block are written into respective bit plane memories 1508 by the bitplane splitter 1504. At the same time, the bit plane splitter 1504 determines the bit plane at which each coefficient will begin to be significant, and stores that information in the significance table 1510. Also, at the same time the bit plane splitter 1504 determines which is the highest bit plane that has significant bits in it and feds the highest significance bitplane number to list memory manager 1502. The list memory manager 1502 also fetches the bitplane number of the lowest bit plane to be coded. Starting from the highest bit plane, the lists memory manager 1502 then performs the operations of the significance propagation pass 314, magnitude refinement pass 316, and cleanup pass 308 or 318 for each bit-plane to the lowest bitplane to be coded. In each pass, it creates a list of positions of all the coefficients that need to be coded/decoded in that pass, which are stored in lists memory 1306. In case of significance propagation pass 314, a new SP list is generated when the list memory manager 1502 is going through the original SP list.

Once a position of the symbol to be coded is determined by the lists memory manager 1502, it instructs the significance of the coefficients in the 3×3 neighbourhood of that position to be read from the significance table 1510 and passed onto the context generation logic circuit 1512. It also retrieves the symbol at that position in the current plane from the bitplane memories 1508. The context generation logic 1512 then calculates the context based on this significance information and passes it to the arithmetic coder (not shown). Also, the symbol at that position in the current bit plane is also passed onto the arithmetic coder (not shown).

Figure 16:
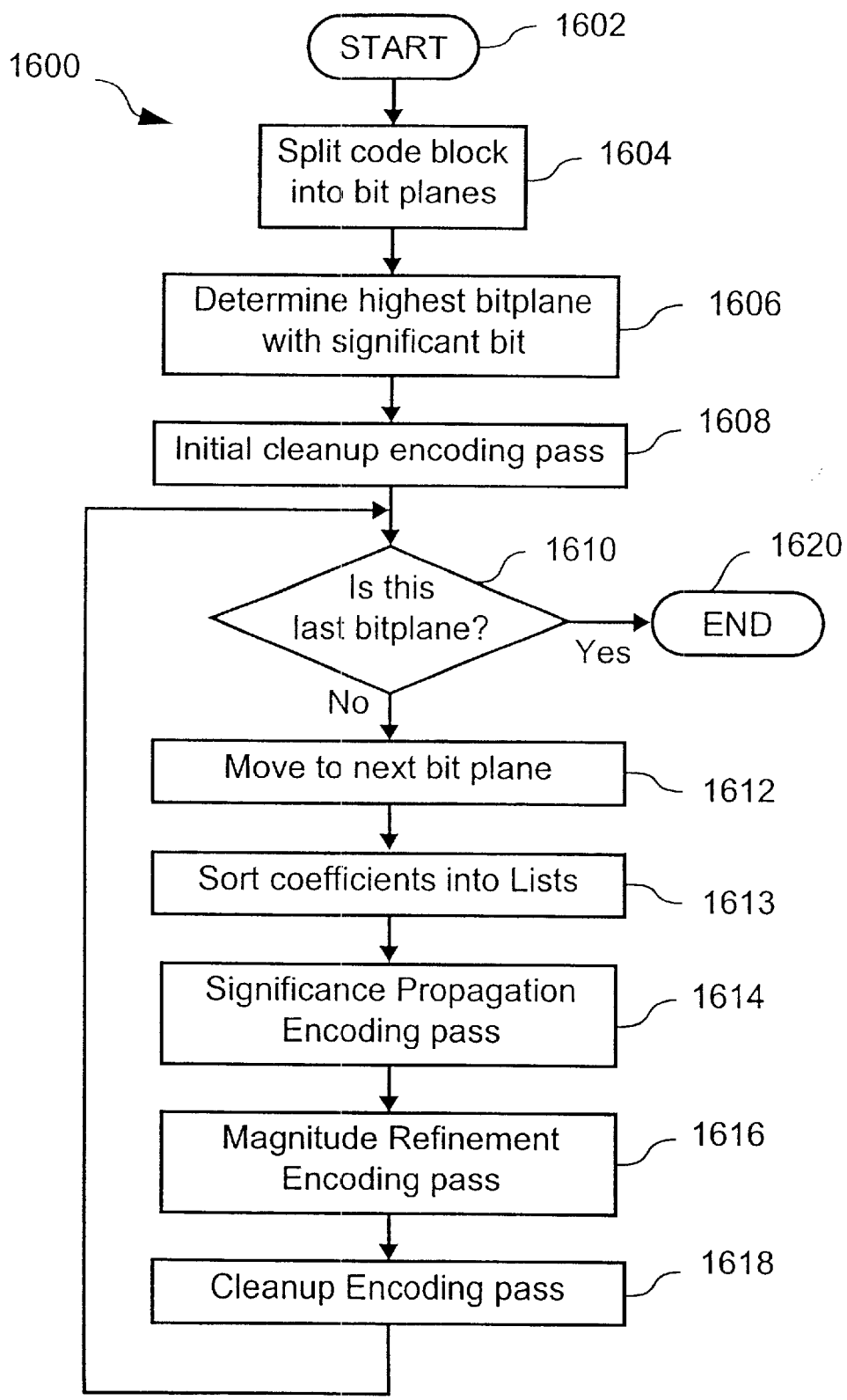
FIG. 16 shows a flow chart of a method of entropy coding in accordance with a second arrangement.

Turning now to FIG. 16, there is shown a flow diagram of another method 1600 of entropy encoding symbols of the transform coefficients of a code block. This method 1600 of entropy encoding symbols is simpler than the method of coding symbols described with reference to FIG. 3. However, it cannot be used for entropy decoding, as it needs to know some bits of the coefficients in advance. Thus, whilst it is simpler it can only be used in entropy encoding.

The method 1600 commences at step 1602 where any necessary parameters are initialised. During the initialisation phase 1602, the method 1600 generates a significance table. This significance table comprises a two-dimensional array of significance states of the coefficients of the code block to be coded. The method 1600 processes the whole code block and determines the bitplane at which each coefficient will begin to be significant, and stores that information in the significance table. The method 1600 can then determine the significance state of a coefficient at a current bitplane with reference to the bitplane number stored in the significance table associated with that coefficient. For example, if the current bitplane is greater than the bitplane number stored in the significance table associated with a coefficient, then that coefficient will be insignificant for that current bitplane. Otherwise the coefficient will be significant. The bitplane numbers are stored in the significance table as an array, with the (row, column) coordinates of the array corresponding to the positions of coefficients within the code block.

Also during the initialisation phase 1602, the method generates three lists named herein as a Significance Propagation list (SP list); a Magnitude Refinement list (MR list); and a Cleanup list (N list). These lists contain the positions of the bit symbols within the code block that are to be coded during the current passes. For instance, the Significance Propagation list contains a list of all those positions of the bit symbols within the code block that are to be coded during a current Significance Propagation Pass. The term the position of the bit symbol refers to herein as the array position within the code block of the transform coefficient to which that bit symbol forms a part of. In addition, the positions within each of these lists are indexed according to the JPEG2000 scanning order (see FIG. 2). Initially, the Significance Propagation list (SP list) and Magnitude Refinement list (MR list) are empty. On the other hand, the Cleanup list (N list) lists all the positions within the code block and is used for the encoding of the highest bitplane having a non-zero bit.

After commencement 1602, the transform coefficients of the code block are then received and split 1604 into bit planes. In the next step 1606 the bit planes of the code block are examined to determine which bit plane possesses the most significant non-zero bit.

The method then proceeds to step 1608, where the bit plane with the most significant bit is entropy encoded in one single cleanup pass. Specifically, the bit symbols belonging to the bitplane, which has the highest non-zero bit are each entropy encoded. These bit symbols are entropy encoded in JPEG2000 scanning order, for example as shown in FIG. 2. The entropy encoding step 1608 takes as input the bit symbol to be encoded and its context, which context is preferably determined in accordance with the JPEG2000.

After completion of step 1608, the method proceeds to decision block 1610, where a check is made whether there are any more bit planes to be processed. If there are, then the method proceeds to step 1612 where the bit symbols of the next bit plane are retrieved.

After the completion of step 1612, the method 1600 proceeds to step 1613. During step 1613, the method 1600 first clears the Significance Propagation list (SP list), the Magnitude Refinement list (MR list), and the Cleanup list (N list). Afterwards, the step 1613 then sorts all the positions within the code block and stores these in the Significance Propagation list (SP list), the Magnitude Refinement list (MR list), and the Cleanup list (N list). The sorting step 1613 stores these positions in such a manner that each position is stored on only one of these lists. These stored positions indicate the (row, column) coordinates of the corresponding coefficients in the code block.

During the sorting step 1613, the method increments through all the positions of the code block in JPEG2000 scanning order.

During a currently scanned position, the sorting step 1613 retrieves the bitplane numbers stored in the significance table corresponding to those positions of the 3×3 neighbourhood surrounding the currently scanned position. The sorting step also retrieves the bitplane number stored in the significance table corresponding to the currently scanned position. As mentioned above, a bitplane number stored in the significance table indicates the bitplane at which the coefficient becomes significant. The sorting step 1613 then determines the significance states of each coefficient in the 3×3 neighbourhood, including significance state of the coefficient at the current position, at the current bitplane. The sorting step 1613 then determines, according to the following rules, which one of the SP, MR or N lists the position is to be stored.

Rule 1. If the coefficient at the current position P(x,y) being scanned has a significance state >=N, where N is the current bitplane being processed, then the current position goes on the MR list.

Rule 2. f the coefficient at the current position P(x,y) being scanned has a significance state <N, and any coefficient in the 3×3 neighbourhood of the current position P(x,y) that is before the current position P(x,y) in the JPEG2000 scanning order, which has a significance state >=N, where N is the current bitplane being processed, then the current position P(x,y) goes on the SP list.

Rule 3. If the coefficient at the current position P(x,y) being scanned has a significance state <N, and any position in the 3×3 neighbourhood of the current position P(x,y) that is after the current position P(x,y) in the JPEG2000 scanning order, which has a significance state >N, where N is the current bitplane being processed, then the current position P(x,y) goes on the SP list.

Rule 4. If the current position P(x,y) being scanned is not stored on the MR or SP list then it is stored on the N list. Namely, the cleanup (N) list contains positions that are not on the SP list and MR list.

In this fashion, the sorting step 1613 sorts the positions of the coefficients into the SP, MR, and N lists for a bitplane N. These lists can then be sent for encoding in the significance propagation pass, magnitude refinement pass, and cleanup pass.

After completion of the sorting step 1613, The method then proceeds to step 1614 for processing the relevant bit symbols in the significance propagation pass of the current bit plane. In this step 1614, the bit symbols in the current bitplane corresponding to the positions in the current SP list generated during step 1613 are entropy encoded.

After the completion of the SP encoding pass 1614, the method proceeds to magnitude refinement encoding pass 1616. In this step 1616, all the bit symbols in the current bit plane corresponding to the positions in the current magnitude refinement list generated during step 1613 are entropy encoded.

After completion of the MR encoding pass 1616, the method proceeds to the cleanup encoding pass 1618. In the cleanup encoding step 1618, all the bit symbols in the current bit plane corresponding to the positions in the current cleanup N list (generated during the previous SP coding pass) are entropy encoded.

After completion of the cleanup coding pass 1618, the method returns to decision block 1610 for processing of any further bit planes. If the decision block returns true (YES), that is there are no more bit planes to be processed, then the method terminates 1620 and returns to the calling method. Otherwise, the method proceeds to step 1612, for processing of the next bitplane. Preferably, the method continues processing the bitplanes down to a predetermined minimum bitplane.

Preferably, the method generates all three lists, namely the SP, MR and N lists. In a variation of this arrangement, the method can generate at least one list of the SP, MR and N lists. In this case, the method scans the whole code block during any pass not having a list.

Figure 17:
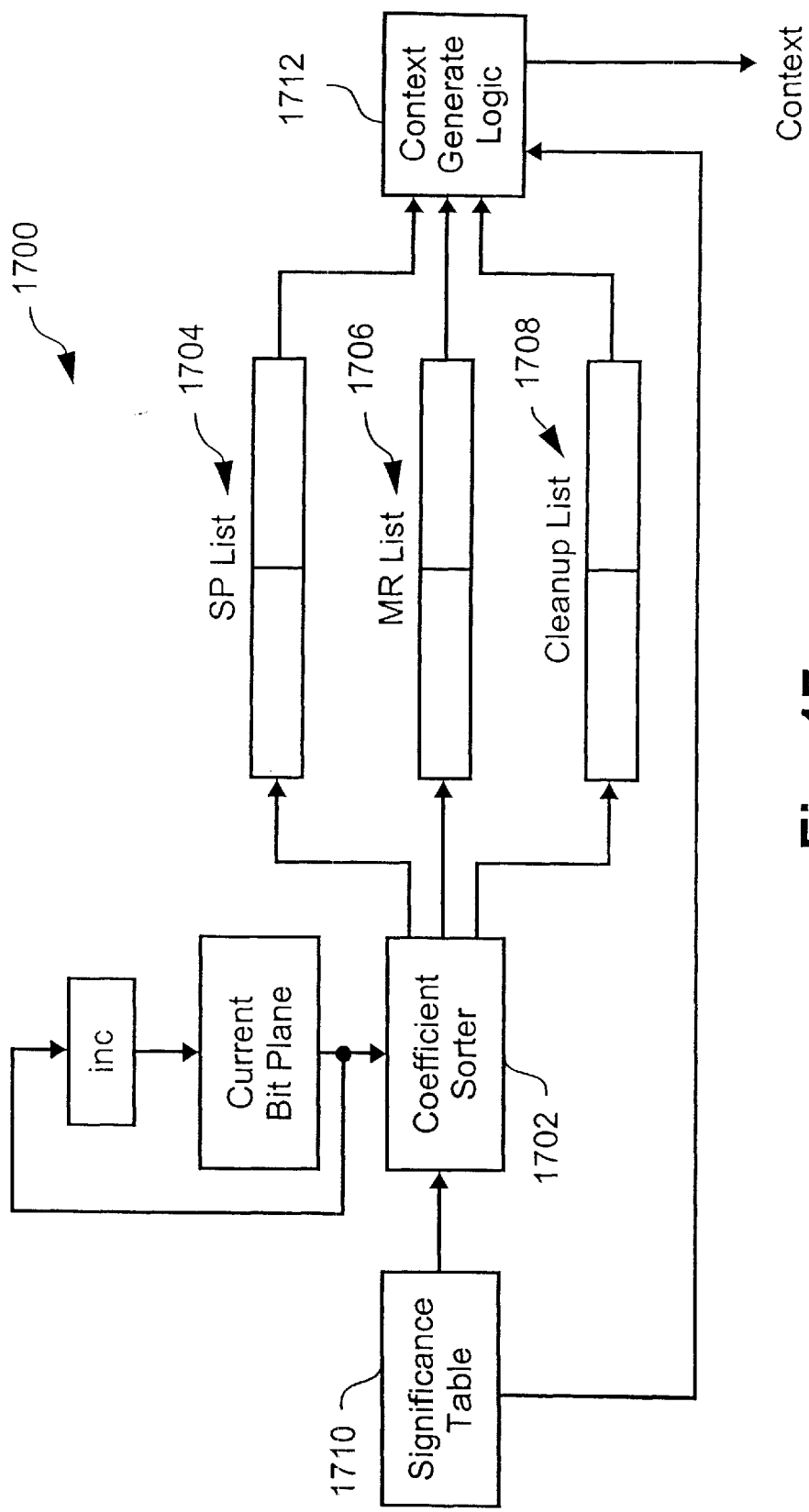
FIG. 17 shows a schematic diagram of an entropy encoder for implementing the entropy encoding method shown in FIG. 16.

Turning now to FIG. 17, there is shown an entropy encoder for implementing the entropy encoding method shown in FIG. 16. The entropy coder 1700 comprises a coefficient sorter for sorting the positions of the coefficients of a current bitplane in accordance with the rules mentioned above with reference to FIG. 16, a bit plane splitter (not shown) for performing the operations 1604 and 1606, bit plane memories (not shown) for storing the bit symbols of each bitplane of the code block, a significance table 1710 for storing the significances of the coefficients. The entropy coder also comprises a SP list memory 1704 for storing the SP list generated by the coefficient sorter 1702, a MR list memory 1706 for storing the MR list generated by the coefficient sorter 1702, a cleanup list memory 1708 for storing the cleanup list generated by the coefficient sorter 1702. The entropy coder further comprises a context generation logic circuit 1712, and an arithmetic coder (not shown) for coding the bit symbols corresponding to the positions stored in the SP list, MR list and cleanup list during their respective passes as described with reference to FIG. 16. The SP list memory 1704 is a double buffer arrangement. While the coefficient sorter 1702 is generating and storing positions in SP list memory 1704 for the SP list of bitplane n, the context generation logic circuit 1712 is reading the completed SP list for bitplane n+1. The MR list memory 1706 and cleanup list memory 1708 also act as double buffers in a similar fashion to the SP list memory 1704.

The aforementioned preferred methods described with reference to FIGS. 3 and 16 comprise a particular control flow. There are many other variants of these methods, which use different control flows without departing the spirit or scope of the invention. For example, the entropy coding method of FIG. 3, comprise in part a number of parallel operations. The entropy coding method of FIG. 3 may be modified to implement these parallel operations as sequential operations as would be apparent to a man skilled in the art. In the latter case, this modified entropy coding method of FIG. 3 is suitable for implementation as software on a general-purpose computer. For example, the pre-processing step 412 and post-processing step 418 may with some modifications operate in sequence. The entropy coding method of FIG. 16 may also be implemented as software on a general-purpose computer.

Figure 18:
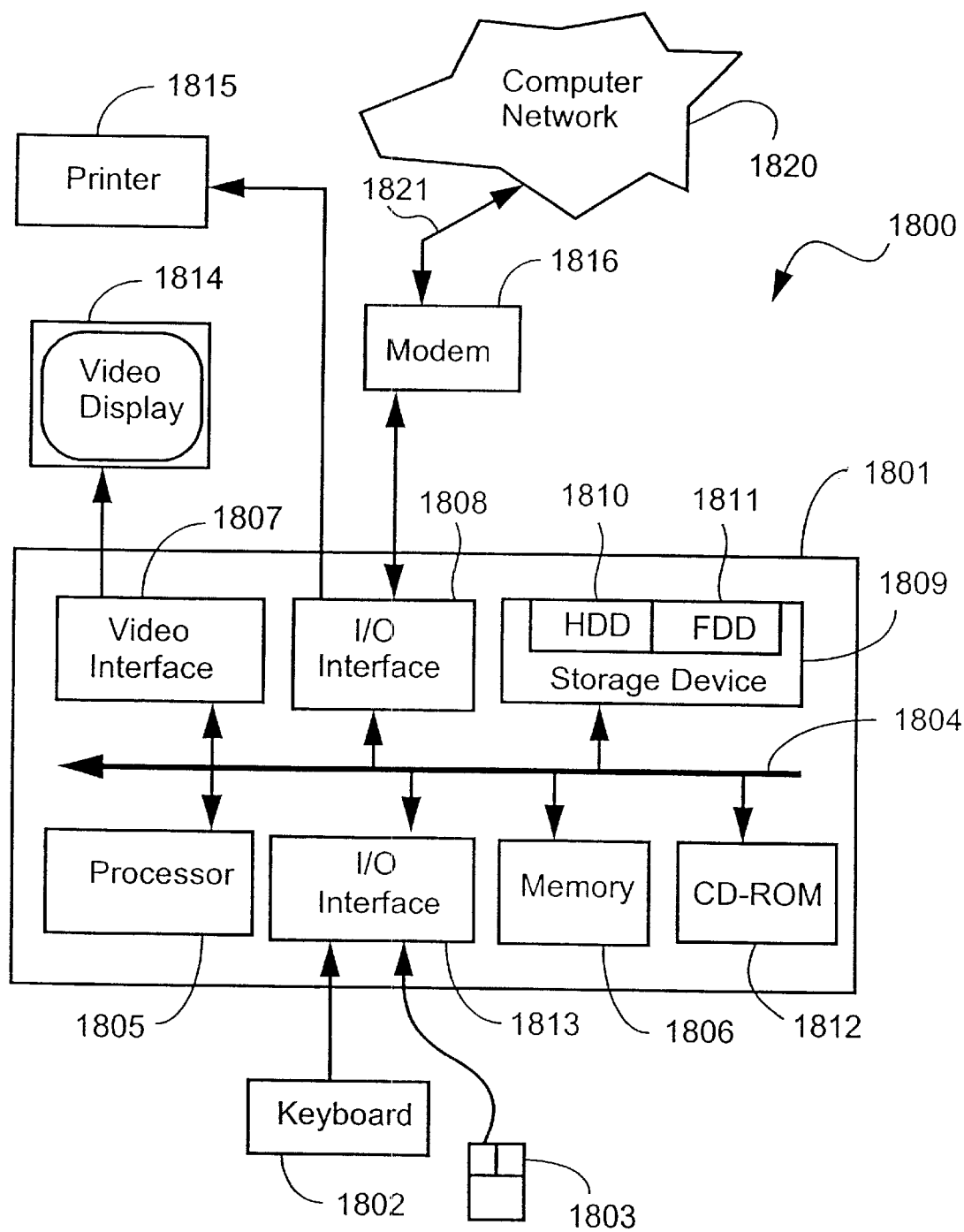
FIG. 18 shows a schematic diagram of a general-purpose computer for implementing the methods of FIGS. 3 and 16.

Turning now to FIG. 18, there is shown a general-purpose computer, which may used to implement the aforementioned methods. The processes of these methods may be implemented as software, such as an application program executing within the computer system 1800. In particular, the steps of the aforementioned methods are effected by instructions in the software that are carried out by the computer. The software may be stored in a computer readable medium, including the storage devices described below, for example. The software is loaded into the computer from the computer readable medium, and then executed by the computer. A computer readable medium having such software or computer program recorded on it is a computer program product.

The computer system 1800 comprises a computer module 1801, input devices such as a keyboard 1802 and mouse 1803, output devices including a printer 1815 and a display device 1814. A Modulator-Demodulator (Modem) transceiver device 1816 is used by the computer module 1801 for communicating to and from a communications network 1820, for example connectable via a telephone line 1821 or other functional medium. The modem 1816 can be used to obtain access to the Internet, and other network systems, such as a Local Area Network (LAN) or a Wide Area Network (WAN).

The computer module 1801 typically includes at least one processor unit 1805, a memory unit 1806, for example formed from semiconductor random access memory (RAM) and read only memory (ROM), input/output (I/O) interfaces including a video interface 1807, and an I/O interface 1813 for the keyboard 1802 and mouse 1803 and optionally a joystick (not illustrated), and an interface 1808 for the modem 1816. A storage device 1809 is provided and typically includes a hard disk drive 1810 and a floppy disk drive 1811. A magnetic tape drive (not illustrated) may also be used. A CD-ROM drive 1812 is typically provided as a non-volatile source of data. The components 1805 to 1813 of the computer module 1801, typically communicate via an interconnected bus 1804 and in a manner, which results in a conventional mode of operation of the computer system 1800 known to those in the relevant art. Examples of computers on which the embodiments can be practised include IBM-PC's and compatibles, Sun Sparcstations or alike computer systems evolved therefrom.

Typically, the application program of the aforementioned methods is resident on the hard disk drive 1810 and read and controlled in its execution by the processor 1805. Intermediate storage of the program and any data fetched from the network 1820 may be accomplished using the semiconductor memory 1806, possibly in concert with the hard disk drive 1810. In some instances, the application program may be supplied to the user encoded on a CD-ROM or floppy disk and read via the corresponding drive 1812 or 1811, or alternatively may be read by the user from the network 1820 via the modem device 1816. Still further, the software can also be loaded into the computer system 1800 from other computer readable medium including magnetic tape, a ROM or integrated circuit, a magneto-optical disk, a radio or infra-red transmission channel between the computer module 1801 and another device, a computer readable card such as a PCMCIA card, and the Internet and Intranets including email transmissions and information recorded on websites and the like. The foregoing is merely exemplary of relevant computer readable mediums. Other computer readable mediums may be practiced without departing from the scope and spirit of the invention.

Industrial Applicability

It is apparent from the above that the embodiment(s) of the invention are applicable to the computer and video graphics industries and related fields such as video and camera industries.

The foregoing describes only some embodiments of the present invention, and modifications and/or changes can be made thereto without departing from the scope and spirit of the invention, the embodiment(s) being illustrative and not restrictive.

We claim:

1. A method of entropy coding symbols representative of a code block comprising transform coefficients of a digital image, the method performing the following steps for each bitplane from a first bitplane to a predetermined minimum bitplane:

a significance propagation step for entropy coding all those symbols in a current bitplane belonging to coefficients that have a significance state of zero in the current bitplane and that have a neighbouring coefficient that has a significance state of one in the current bitplane;

a magnitude refinement step for entropy coding all those symbols in the current bitplane that belong to coefficients that have a significance state of one in a previous bitplane; and a cleanup step for entropy coding all those symbols in the current bitplane that have not been previously entropy coded during the significance propagation step or magnitude refinement step of the current bitplane; wherein the method further comprises the steps of:

generating, prior to the significance propagation step of the current bitplane, a first list of positions of those said coefficients in the code block that have symbols to be entropy coded during the significance propagation step of the current bitplane;

generating, prior to the magnitude refinement step of the current bitplane, a second list of positions of those said coefficients in the code block that have symbols to be entropy coded during the magnitude refinement step of the current bitplane; and generating, prior to the cleanup step of the current bitplane, a third list of positions of those said coefficients in the code block that have symbols to be entropy coded during the cleanup step of the current bitplane.

2. The method as claimed in claim 1, wherein said step of generating said first and second lists is performed during the cleanup step of a previous bitplane.

3. The method as claimed in claim 1, wherein said step of generating said third list is performed during the significance propagation step of the current bitplane.

4. The method as claimed in claim 1, wherein said significance propagation step of the current bitplane comprises the following sub-steps:

entropy coding those symbols in the current bitplane corresponding to the positions in the first list generated by said cleanup step of a previous bitplane;

entropy coding any symbol in the current bitplane, that has an insignificance state of zero, that has as a neighbour a coefficient having a symbol previously entropy coded during the significance propagation step of the current bitplane and which said neighbour transitions to a significance state of one during the significance propagation step of the current bitplane, and that follows said neighbour in a predetermined scanning order;

generating a fourth list of positions of those said coefficients in the code block that have an insignificant state of zero and that neighbour said coefficients having symbols entropy coded during the significance propagation step of the current bitplane that have a significance state of one;

tagging those positions on the first list of said coefficients that transition to a significance state of one during the significance propagation step of the current bitplane;

tagging those positions on the fourth list of said coefficients that transition to a significance state of one during the significance propagation step of the current bitplane; and generating said third list of positions of coefficients in the code block.

5. The method as claimed in claim 4, wherein the cleanup step comprises the sub-steps of:

entropy coding those symbols in the current bitplane corresponding to the positions in the third list generated by said significance propagation step of the current bitplane;

generating a fifth list of positions of those said coefficients in the code block that have a symbol entropy coded during the cleanup step of the current bitplane, and that transition to a significance state of one during the cleanup step of the current bitplane; and generating a sixth list of positions of those said coefficients in the code block that have a symbol entropy coded during the cleanup step of the current bitplane, and that have a significance state of zero during the cleanup step of the current bitplane.

6. The method as claimed in claim 5, wherein the cleanup step comprises the sub-steps of:

sorting said first list into a seventh list of positions which are said tagged and into a eighth list of positions which are not tagged; and sorting said fourth list into a ninth list of positions which are said tagged and into a tenth list of positions which are not tagged.

7. The method as claimed in claim 6, wherein the cleanup step for the current bitplane comprises the sub-steps of:

comparing and merging said positions on said second, fifth, seventh, and ninth lists to generate a said second list of positions for the next bitplane after the current bitplane;

comparing and merging said positions on said sixth, eighth, and tenth lists to generate a said first list of positions for the next bitplane after the current bitplane; and removing from said generated first list any positions of coefficients in the code block that have a significance state of one.

8. The method as claimed in claim 1, wherein said first bitplane is the next bitplane below the highest bitplane of the code block having a significant coefficient.

9. The method as claimed in claim 8, wherein the method comprises the step of:

an initial cleanup step for entropy coding all the symbols in said highest bitplane of the code block.

10. The method as claimed in claim 9, wherein the initial cleanup step comprises the sub-steps of:

generating a said first list of positions of coefficients in the code block that have symbols to be entropy coded during the significance propagation step for said first bitplane; and generating a said second list of positions of coefficients in the code block that have symbols to be entropy coded during the magnitude refinement step for said first bitplane.

11. A method as claimed in claim 9, wherein the initial cleanup step comprises the sub-steps:

determining, for each said symbol coded during the initial cleanup coding pass, the significance state of the coefficient to which the entropy coded symbol belongs; and if said significance state is one performing the following sub-steps:
  setting a first flag to one; and
  determining the neighbouring coefficients of the coefficient having said determined significance state of one and setting a second flag to one for each said neighbouring coefficient;
otherwise if said determined significance state is zero performing the following sub-step:
  setting said first flag to zero;
generating a said second list of positions of coefficients in the code block having said symbols that are to be entropy coded during the magnitude refinement step for said first bitplane, wherein a said position of a said coefficient is added to said second list if its associated said first flag is one;
generating a said first list of positions of coefficients in the code block having said symbols that are to be entropy coded during the significance propagation step for said first bitplane, wherein a said position of a said coefficient is added to said first list if its associated said second flag is one and its associated said first flag is zero.

12. The method as claimed in claim 1, wherein said method of entropy coding is capable of entropy encoding or decoding said symbols.

13. The method as claimed in claim 1, wherein said method of entropy coding is a method of entropy encoding said symbols and said step of generating said first, second, and third lists for the current bitplane are generated prior to the significance propagation step of the current bitplane.

14. The method as claimed in claim 13, wherein said method of generating said second list of the current bitplane comprises the sub-steps:
  adding the positions of those coefficients in the code block to the second list which have a significance state greater than or equal to N, where N is the current bitplane number.

15. The method as claimed in claim 13 or 14, wherein said method of generating said first list of the current bitplane comprises the sub-steps:
  adding the position of any coefficient in the code block to the first list that has a significance state less than N and that has preceding in a predetermined scanning order a neighbouring coefficient which has a significance state greater than or equal to N, where N is the current bitplane number.

16. Apparatus for entropy coding symbols representative of a code block comprising transform coefficients of a digital image, said apparatus comprising:
  a bitplane splitter for splitting said code block into bitplanes of symbols from a first bitplane to a predetermined minimum bitplane;
  an entropy coder for coding said symbols during a significance propagation pass, a magnitude refinement pass, and a cleanup pass;
  a list memory manager for generating, prior to the significance propagation pass of a current bitplane, a first list of positions of those said coefficients in the code block that have symbols to be entropy coded during a significance propagation pass of the current bitplane, for generating, prior to the magnitude refinement pass of the current bitplane, a second list of positions of those said coefficients in the code block that have symbols to be entropy coded during a magnitude refinement pass of the current bitplane; and for generating, prior to the cleanup pass of the current bitplane, a third list of positions of those said coefficients in the code block that have symbols to be entropy coded during the cleanup pass of the current bitplane; and
  memory storage for storing said first list, second list, and third list of positions.

17. Apparatus as claimed in claim 16, wherein said memory storage comprises:
  a first memory storage, wherein said first memory storage is a double buffer for inputting and storing a said first list of a bitplane n generated by the list memory manager and at the same time outputting an already generated and stored said first list of a bitplane n+1;
  a second memory storage, wherein said second memory storage is a double buffer for inputting and storing a said second list of a bitplane n generated by the list memory manager and at the same time outputting an already generated and stored said second list of a bitplane n+1; and
  a third memory storage, wherein said third memory storage is a double buffer for inputting and storing a said third list of a bitplane n generated by the list memory manager and at the same time outputting an already generated and stored said third list of a bitplane n+1.

18. The apparatus as claimed in claim 16, wherein said list memory manager generates said first and second lists during said entropy coding of said symbols during a cleanup pass of a previous bitplane.

19. The apparatus as claimed in claim 16, wherein said list memory manager generates said third list during said entropy coding of said symbols during a significance propagation pass of the current bitplane.

20. The apparatus as claimed in claim 16, wherein said entropy coder comprises:
  means for entropy coding, during said significance propagation pass of the current bitplane, those symbols in the current bitplane corresponding to the positions in the first list generated by said cleanup pass of a previous bitplane; and
  means for entropy coding, during said significance propagation pass of the current bitplane, any symbol in the current bitplane, that has an insignificance state of zero, that has as a neighbour a coefficient having a symbol previously entropy coded during the significance propagation pass of the current bitplane and which said neighbour transitions to a significance state of one during the significance propagation pass of the current bitplane, and that follows said neighbour in a predetermined scanning order; and
  wherein said list memory manager comprises:
    means for generating a fourth list of positions of those said coefficients in the code block that have an insignificant state of zero and that neighbour said coefficients having symbols entropy coded during the significance propagation pass of the current bitplane that have a significance state of one;
    means for tagging those positions on the first list of said coefficients that transition to a significance state of one during the significance propagation pass of the current bitplane;
    means for tagging those positions on the fourth list of said coefficients that transition to a significance state of one during the significance propagation pass of the current bitplane; and means for generating said third list of positions of coefficients in the code block.

21. The apparatus as claimed in claim 20, wherein the entropy coder comprises:

means for entropy coding, during the cleanup pass of the current bitplane, those symbols in the current bitplane corresponding to the positions in the third list generated by said significance propagation pass of the current bitplane; and wherein said list memory manager comprises:

means for generating a fifth list of positions of those said coefficients in the code block that have a symbol entropy coded during the cleanup pass of the current bitplane, and that transition to a significance state of one during the cleanup pass of the current bitplane; and means for generating a sixth list of positions of those said coefficients in the code block that have a symbol entropy coded during the cleanup pass of the current bitplane, and that have a significance state of zero during the cleanup pass of the current bitplane.

22. The apparatus as claimed in claim 21, wherein the list memory manager comprises:

means for sorting said first list into a seventh list of positions which are said tagged and into a eighth list of positions which are not tagged; and means for sorting said fourth list into a ninth list of positions which are said tagged and into a tenth list of positions which are not tagged.

23. The apparatus as claimed in claim 22, wherein the list memory manager comprises:

means for comparing and merging said positions on said second, fifth, seventh, and ninth lists to generate a said second list of positions for the next bitplane after the current bitplane;

means for comparing and merging said positions on said sixth, eighth, and tenth lists to generate a said first list of positions for the next bitplane after the current bitplane; and means for removing from said generated first list any positions of coefficients in the code block that have a significance state of one.

24. The apparatus as claimed in claim 16, wherein said first bitplane is the next bitplane below the highest bitplane of the code block having a significant coefficient.

25. The apparatus as claimed in claim 24, wherein the entropy coder, during an initial cleanup pass, entropy codes all the symbols in said highest bitplane of the code block.

26. The apparatus as claimed in claim 25, wherein the list manager comprises:

means for generating, during the initial cleanup pass, a said first list of positions of coefficients in the code block that have symbols to be entropy coded during the significance propagation pass for said first bitplane; and means for generating, during the initial cleanup pass, a said second list of positions of coefficients in the code block that have symbols to be entropy coded during the magnitude refinement pass for said first bitplane.

27. The apparatus as claimed in claim 25, wherein the list manager comprises:

means for determining, for each said symbol coded during the initial cleanup coding pass, the significance state of the coefficient to which the entropy coded symbol belongs;

wherein said determining means comprises:

means for setting, if said significance state is one, a first flag to one;

means for determining, if said significance state is one, the neighbouring coefficients of the coefficient having said determined significance state of one and setting a second flag to one for each said neighbouring coefficient; and means for setting, if said determined significance state is zero, said first flag to zero;

means for generating, during the initial cleanup coding pass a said second list of positions of coefficients in the code block having said symbols that are to be entropy coded during the magnitude refinement pass for said first bitplane, wherein a said position of a said coefficient is added to said second list if its associated said first flag is one;

means for generating, during the initial cleanup coding pass a said first list of positions of coefficients in the code block having said symbols that are to be entropy coded during the significance propagation pass for said first bitplane, wherein a said position of a said coefficient is added to said first list if its associated said second flag is one and its associated said first flag is zero.

28. The apparatus as claimed in claim 16, wherein said apparatus of entropy coding is capable of entropy encoding or decoding said symbols.

29. The apparatus as claimed in claim 16, wherein said apparatus of entropy coding is an apparatus of entropy encoding said symbols and said list memory manager generates said first, second, and third lists for the current bitplane prior to the significance propagation pass of the current bitplane.

30. The apparatus as claimed in claim 29, wherein said list memory manager comprises:

means for adding the positions of those coefficients in the code block to the second list which have a significance state greater than or equal to N, where N is the current bitplane number.

31. The apparatus as claimed in claim 29, wherein said list memory manager comprises:

means for adding the position of any coefficient in the code block to the first list that has a significance state less than N and that has preceding in a predetermined scanning order a neighbouring coefficient which has a significance state greater than or equal to N, where N is the current bitplane number.

32. A computer program product comprising a computer program for entropy coding symbols representative of a code block comprising transform coefficients of a digital image, the computer program comprising:

code for splitting said code block into bitplanes of symbols from a first bitplane to a predetermined minimum bitplane;

code for entropy coding said symbols during a significance propagation pass, a magnitude refinement pass, and a cleanup pass;

code for generating, prior to the significance propagation pass of a current bitplane, a first list of positions of those said coefficients in the code block that have symbols to be entropy coded during a significance propagation pass of the current bitplane;

code for generating, prior to the magnitude refinement pass of the current bitplane, a second list of positions of those said coefficients in the code block that have symbols to be entropy coded during a magnitude refinement pass of the current bitplane;

code for generating, prior to the cleanup pass of the current bitplane, a third list of positions of those said coefficients in the code block that have symbols to be entropy coded during the cleanup pass of the current bitplane; and code for storing said first list, second list, and third list of positions.

33. A method of entropy coding symbols representative of a code block comprising transform coefficients of a digital image, the method performing the following steps for each bitplane from a first bitplane to a predetermined minimum bitplane:

coding symbols of said transform coefficients of a current bitplane of the codeblock during a significance propagation pass, a magnitude refinement pass, and a cleanup pass in accordance with a first, second, and third list of positions of the coefficients having said symbols to be entropy encoded in the current bitplane respectively;

generating a said first list of positions for a next bitplane after the current bitplane, a second list of positions for the next bitplane after the current bitplane; and a third list for the current bitplane; wherein the generating step comprises the sub-steps of:

generating, during the significance propagation pass of the current bitplane, a fourth list of positions of those said coefficients in the code block that have an insignificant state of zero and that neighbour said coefficients having symbols entropy coded during the significance propagation pass of the current bitplane that have a significance state of one;

tagging, during the significance propagation pass of the current bitplane, those positions on the first list of positions of coefficients for the current bitplane that transition to a significance state of one during the significance propagation pass of the current bitplane;

tagging, during the significance propagation pass of the current bitplane, those positions on the fourth list of said positions of coefficients that transition to a significance state of one during the significance propagation pass of the current bitplane;

generating, during the significance propagation pass of the current bitplane, said third list of positions for the current bitplane, wherein said third list comprises a list of all those positions of the codeblock excluding those positions of the said second list of positions for the current bitplane and those positions of coefficients having symbols entropy coded during the significant propagation pass of the current bitplane;

generating, during the cleanup pass of the current bitplane, a fifth list of positions of those said coefficients in the code block that have a symbol entropy coded during the cleanup pass of the current bitplane, and that transition to a significance state of one during the cleanup pass of the current bitplane;

generating, during the cleanup pass of the current bitplane, a sixth list of positions of those said coefficients in the code block that have a symbol entropy coded during the cleanup pass of the current bitplane, and that have a significance state of zero during the cleanup pass of the current bitplane;

sorting, during the cleanup pass of the current bitplane, said tagged and those not tagged first list of positions for the current bitplane into a seventh list of positions and into a eighth list of positions respectively;

sorting, during the cleanup pass of the current bitplane, said tagged and those not tagged fourth list of positions into a ninth list of positions and into a tenth list of positions respectively;

comparing and merging, during the cleanup pass of the current bitplane, said positions on said second, fifth, seventh, and ninth lists to generate a said second list of positions for the next bitplane after the current bitplane;

comparing and merging, during the cleanup pass of the current bitplane, said positions on said sixth, eighth, and tenth lists to generate a said first list of positions for the next bitplane after the current bitplane; and removing, during the cleanup pass of the current bitplane, from said generated first list for the next bitplane any positions of coefficients in the code block that have a significance state of one.

34. Apparatus for entropy coding symbols representative of a code block comprising transform coefficients of a digital image, the apparatus comprising:

an entropy coder for coding symbols of said transform coefficients of a current bitplane of the codeblock during a significance propagation pass, a magnitude refinement pass, and a cleanup pass in accordance with a first, second, and third list of positions of the coefficients having said symbols to be entropy encoded in the current bitplane respectively;

a list memory manager for generating a said first list of positions for a next bitplane after the current bitplane, a second list of positions for the next bitplane after the current bitplane; and a third list for the current bitplane; wherein the list memory manager comprises:

means for generating, during the significance propagation pass of the current bitplane, a fourth list of positions of those said coefficients in the code block that have an insignificant state of zero and that neighbour said coefficients having symbols entropy coded during the significance propagation pass of the current bitplane that have a significance state of one;

means for tagging, during the significance propagation pass of the current bitplane, those positions on the first list of positions of coefficients for the current bitplane that transition to a significance state of one during the significance propagation pass of the current bitplane;

means for tagging, during the significance propagation pass of the current bitplane, those positions on the fourth list of said positions of coefficients that transition to a significance state of one during the significance propagation pass of the current bitplane;

means for generating, during the significance propagation pass of the current bitplane, said third list of positions for the current bitplane, wherein said third list comprises a list of all those positions of the codeblock excluding those positions of the said second list of positions for the current bitplane and those positions of coefficients having symbols entropy coded during the significant propagation pass of the current bitplane;

means for generating, during the cleanup pass of the current bitplane, a fifth list of positions of those said coefficients in the code block that have a symbol entropy coded during the cleanup pass of the current bitplane, and that transition to a significance state of one during the cleanup pass of the current bitplane;

means for generating, during the cleanup pass of the current bitplane, a sixth list of positions of those said coefficients in the code block that have a symbol entropy coded during the cleanup pass of the current bitplane, and that have a significance state of zero during the cleanup pass of the current bitplane;

means for sorting, during the cleanup pass of the current bitplane, said tagged and those not tagged first list of positions for the current bitplane into a seventh list of positions and into a eighth list of positions respectively;

means for sorting, during the cleanup pass of the current bitplane, said tagged and those not tagged fourth list of positions into a ninth list of positions and into a tenth list of positions respectively;

means for comparing and merging, during the cleanup pass of the current bitplane, said positions on said second, fifth, seventh, and ninth lists to generate a said second list of positions for the next bitplane after the current bitplane;

means for comparing and merging, during the cleanup pass of the current bitplane, said positions on said sixth, eighth, and tenth lists to generate a said first list of positions for the next bitplane after the current bitplane; and means for removing, during the cleanup pass of the current bitplane, from said generated first list for the next bitplane any positions of coefficients in the code block that have a significance state of one.

35. A computer program product comprising a computer program for entropy coding symbols representative of a code block comprising transform coefficients of a digital image, the computer program comprising:

code for entropy coding symbols of said transform coefficients of a current bitplane of the codeblock during a significance propagation pass, a magnitude refinement pass, and a cleanup pass in accordance with a first, second, and third list of positions of the coefficients having said symbols to be entropy encoded in the current bitplane respectively;

code for generating a said first list of positions for a next bitplane after the current bitplane, a second list of positions for the next bitplane after the current bitplane; and a third list for the current bitplane; wherein the generating code comprises:

code for generating, during the significance propagation pass of the current bitplane, a fourth list of positions of those said coefficients in the code block that have an insignificant state of zero and that neighbour said coefficients having symbols entropy coded during the significance propagation pass of the current bitplane that have a significance state of one;

code for tagging, during the significance propagation pass of the current bitplane, those positions on the first list of positions of coefficients for the current bitplane that transition to a significance state of one during the significance propagation pass of the current bitplane;

code for tagging, during the significance propagation pass of the current bitplane, those positions on the fourth list of said positions of coefficients that transition to a significance state of one during the significance propagation pass of the current bitplane;

code for generating, during the significance propagation pass of the current bitplane, said third list of positions for the current bitplane, wherein said third list comprises a list of all those positions of the codeblock excluding those positions of the said second list of positions for the current bitplane and those positions of coefficients having symbols entropy coded during the significant propagation pass of the current bitplane;

code for generating, during the cleanup pass of the current bitplane, a fifth list of positions of those said coefficients in the code block that have a symbol entropy coded during the cleanup pass of the current bitplane, and that transition to a significance state of one during the cleanup pass of the current bitplane;

code for generating, during the cleanup pass of the current bitplane, a sixth list of positions of those said coefficients in the code block that have a symbol entropy coded during the cleanup pass of the current bitplane, and that have a significance state of zero during the cleanup pass of the current bitplane;

code for sorting, during the cleanup pass of the current bitplane, said tagged and those not tagged first list of positions for the current bitplane into a seventh list of positions and into a eighth list of positions respectively;

code for sorting, during the cleanup pass of the current bitplane, said tagged and those not tagged fourth list of positions into a ninth list of positions and into a tenth list of positions respectively;

code for comparing and merging, during the cleanup pass of the current bitplane, said positions on said second, fifth, seventh, and ninth lists to generate a said second list of positions for the next bitplane after the current bitplane;

code for comparing and merging, during the cleanup pass of the current bitplane, said positions on said sixth, eighth, and tenth lists to generate a said first list of positions for the next bitplane after the current bitplane; and code for removing, during the cleanup pass of the current bitplane, from said generated first list for the next bitplane any positions of coefficients in the code block that have a significance state of one.

* * * * *

UNITED STATES PATENT AND TRADEMARK OFFICE
CERTIFICATE OF CORRECTION

PATENT NO. : 6,545,618 B2
DATED : April 8, 2003
INVENTOR(S) : Dominic Yip

It is certified that error appears in the above-identified patent and that said Letters Patent is hereby corrected as shown below:

<u>Drawings,</u>
SHEET 6, FIG. 7A, "Initialisation" should read -- Initialization --; and "Is there" should read -- Are there --.

<u>Column 1,</u>
Line 7, "herein after" should read -- hereinafter --.

<u>Column 2,</u>
Line 32, "will" should read -- will be --.

<u>Column 3,</u>
Line 62, "utilised" should read -- utilized --; and
Line 67, "utilised" should read -- utilized --.

<u>Column 4,</u>
Line 56, "above mentioned" should read -- above-mentioned --.

<u>Column 8,</u>
Line 64, "or" should read -- or not --.

<u>Column 10,</u>
Line 31, "is" should read -- a --.

<u>Column 14,</u>
Line 16, "hand," should read -- other hand, --.

<u>Column 15,</u>
Line 42, "in" (second occurrence) should be deleted; and
Line 43, "the" (first occurrence) should be deleted.

<u>Column 18,</u>
Line 25, "same" should read --same time--.

<u>Column 20,</u>
Line 20, "positionspassed" should read -- positions passed --; and
Line 59, "has not" should be deleted.

UNITED STATES PATENT AND TRADEMARK OFFICE
CERTIFICATE OF CORRECTION

PATENT NO.   : 6,545,618 B2
DATED        : April 8, 2003
INVENTOR(S)  : Dominic Yip It is certified that error appears in the above-identified patent and that said Letters Patent is hereby corrected as shown below:

Column 29,
Line 63, "may" should read -- may be --.

Column 32,
Line 26, "a" should read -- an --.

Column 35,
Line 25, "a" should read -- an --.

Column 37,
Line 63, "a" should read -- an --.

Column 39,
Line 4, "a" should read -- an --.

Column 40,
Line 31, "a" should read -- an --.

Signed and Sealed this

Eighteenth Day of November, 2003

JAMES E. ROGAN
*Director of the United States Patent and Trademark Office*